(12) United States Patent
Nakamura et al.

(10) Patent No.: US 9,523,589 B2
(45) Date of Patent: Dec. 20, 2016

(54) ROTATION ANGLE MEASUREMENT APPARATUS

(71) Applicant: ASAHI KASEI MICRODEVICES CORPORATION, Tokyo (JP)

(72) Inventors: Takenobu Nakamura, Tokyo (JP); Shigeki Okatake, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 250 days.

(21) Appl. No.: 14/174,120

(22) Filed: Feb. 6, 2014

(65) Prior Publication Data

US 2014/0225596 A1    Aug. 14, 2014

(30) Foreign Application Priority Data

Feb. 12, 2013  (JP) ................... 2013-024616
Jan. 24, 2014  (JP) ................... 2014-011348
Jan. 24, 2014  (JP) ................... 2014-011349

(51) Int. Cl.
  *G01B 7/14*   (2006.01)
  *G01D 5/14*   (2006.01)
  *G01R 33/07*  (2006.01)

(52) U.S. Cl.
  CPC .............. *G01D 5/145* (2013.01); *G01D 5/142* (2013.01); *G01R 33/07* (2013.01)

(58) Field of Classification Search
  CPC ......... G01R 33/07; G01R 33/77; G01D 5/145; G01D 3/30
  See application file for complete search history.

(56) References Cited

U.S. PATENT DOCUMENTS 4,939,435 A   7/1990  Takahashi et al.
5,789,925 A   8/1998  Yokotani et al.
(Continued)

FOREIGN PATENT DOCUMENTS

JP   H01-270627 A   10/1989
JP   09-178512 A    7/1997
(Continued)

OTHER PUBLICATIONS

Japanese Office Action issued in Japanese Patent Application No. 2015-235527 on Aug. 30, 2016.

*Primary Examiner* — Minh N Tang
(74) *Attorney, Agent, or Firm* — Morgan, Lewis & Bockius LLP

(57) ABSTRACT

A rotation angle measurement apparatus includes: a first Hall element pair for detecting a magnetic component in a first direction; a second Hall element pair for detecting a magnetic component in a second direction different from the first direction; a third Hall element pair for detecting a magnetic component in a third direction different from the first direction and the second direction; and a fourth Hall element pair for detecting a magnetic component in a fourth direction different from the first to third directions. An angle calculation unit calculates a first rotation angle θ of a rotating magnet based upon the strengths of the output signals from the first Hall element pair and the second Hall element pair, and calculates a second rotation angle θc of the rotating magnet based upon the strengths of the output signals from the third Hall element pair and the fourth Hall element pair.

28 Claims, 26 Drawing Sheets

(56) References Cited

U.S. PATENT DOCUMENTS

| | | | |
|---|---|---|---|
| 6,545,462 B2 | 4/2003 | Schott et al. | |
| 7,235,968 B2 | 6/2007 | Popovic et al. | |
| 8,232,795 B2 | 7/2012 | Saruki et al. | |
| 8,729,890 B2 * | 5/2014 | Donovan | 324/161 |
| 9,182,456 B2 * | 11/2015 | Shoemaker | G01R 33/075 |
| 2002/0021124 A1 | 2/2002 | Schott et al. | |
| 2005/0127899 A1 | 6/2005 | Kakuta et al. | |
| 2009/0309590 A1 | 12/2009 | Kataoka et al. | |
| 2011/0031965 A1 * | 2/2011 | Saruki | G01D 3/036 |
| | | | 324/207.25 |
| 2011/0202308 A1 | 8/2011 | Kishida et al. | |

FOREIGN PATENT DOCUMENTS

| | | |
|---|---|---|
| JP | 2002-71381 A | 3/2002 |
| JP | 2004-257995 A | 9/2004 |
| JP | 2004-271244 A | 9/2004 |
| JP | 2005-043228 A | 2/2005 |
| JP | 2005-315696 A | 11/2005 |
| JP | 2010-190872 A | 9/2010 |
| JP | 2010-261857 A | 11/2010 |
| JP | 2011-38855 A | 2/2011 |
| JP | 2011-158488 A | 8/2011 |
| JP | 2012-150003 A | 8/2012 |
| JP | 2013-047693 A | 3/2013 |
| JP | 2013-047694 A | 3/2013 |
| WO | 03/081182 A1 | 10/2003 |
| WO | 2007-119569 A1 | 10/2007 |

* cited by examiner

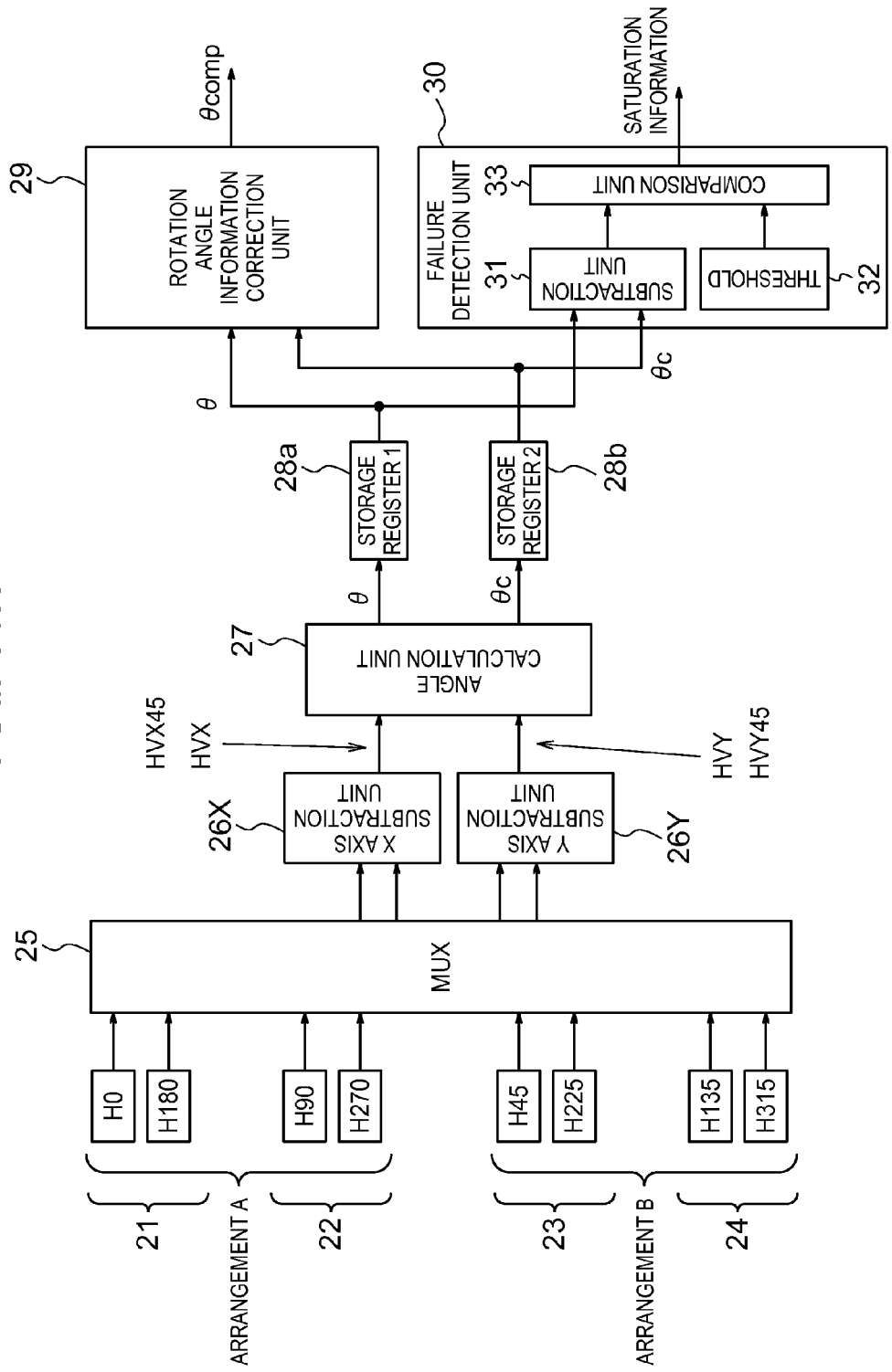

ROTATION ANGLE MEASUREMENT APPARATUS

TECHNICAL FIELD

The present invention relates to a rotation angle measurement apparatus using a magnetic flux concentrator.

BACKGROUND ART

In recent years, various uses of high-function magnetic sensor LSIs with magnetic detection elements (such as Hall elements or magneto resistance elements) and a signal processing circuit (i.e., LSI) integrated together have been promoted. For example, in automobiles, there is a rotation angle sensor for detecting a rotation angle of a steering wheel. PTL 1, for example, proposes such a rotation angle sensor. PTL 1 discloses a rotation angle sensor using a magnetic flux concentrator for collecting and amplifying surrounding magnetic fields and Hall elements on a silicon substrate.

FIG. 1 is a configuration diagram illustrative of the rotation angle sensor described in PTL 1. The rotation angle sensor includes a rotating magnet 1 attached to a rotor and an integrated circuit (i.e., silicon substrate) 2 disposed under the rotating magnet 1 separated from the rotating magnet 1. On the silicon substrate 2, Hall elements 3 formed on the silicon substrate 2 and a magnetic flux concentrator 4 formed on the Hall elements 3 are provided. A magnetic field (i.e., transverse magnetic field) parallel to a plane of the silicon substrate 2 generated by the rotating magnet 1 is detected by using the magnetic flux concentrator 4 and the Hall elements 3, so that a rotation angle of the rotating magnet 1 is calculated.

FIG. 2 is a diagram illustrative of an arrangement of the Hall elements and the magnetic flux concentrator formed on the silicon substrate as illustrated in FIG. 1. Supposing that a plane parallel to the silicon substrate 2 is an XY plane, the circular magnetic flux concentrator 4 is arranged around an origin on the XY plane. Four Hall elements 3 are arranged under a circumference forming an edge of the magnetic flux concentrator 4. The Hall elements (H0, H180) 3 are arranged in symmetrical positions about the origin on the X axis. In the same way, The Hall elements (H90, H270) 3 are arranged in symmetrical positions about the origin on the Y axis. The H0 and H90 Hall elements are arranged in positions having positive coordinate components on the XY coordinate plane in FIG. 2.

FIG. 3 is a cross-sectional view illustrative of the rotating magnet, the magnetic flux concentrator, the Hall elements, and the silicon substrate illustrated in FIG. 1 taken along an X axis direction. A direction extending vertically from the silicon substrate 2 toward the rotating magnet 1 is a Z axis positive direction. A direction extending from H180 toward H0 is an X axis positive direction. Furthermore, two Hall elements are illustrated in positions symmetrical about a center of the magnetic flux concentrator 4 under the edge of the magnetic flux concentrator 4. Magnetosensitive planes of the Hall elements H0 and H180 are perpendicular to the plane of the silicon substrate 2. Therefore, each of the Hall elements H0 and H180 detects a magnetic field in a Z axis direction.

As illustrated in FIG. 3, however, a magnetic field generated from the rotating magnet 1 is attracted to the magnetic flux concentrator 4. A transverse magnetic field parallel to the plane of the silicon substrate 2 (an X axis component of the magnetic field in FIG. 3) is bent to a direction (Z axis direction) perpendicular to the plane of the silicon substrate 2 and passes through the magnetosensitive planes of the Hall elements. Therefore, it is possible for these Hall elements to detect the transverse magnetic field as a signal.

With such a configuration, the Hall elements H0 and H180 illustrated in FIG. 2 detect an X axis component and a Z axis component of a magnetic field incident on the magnetic flux concentrator 4. In the same way, H90 and H270 detect a Y axis component and the Z axis component.

FIG. 2 illustrates a state in which a magnetic field is incident on the magnetic flux concentrator 4 in a direction of θ counterclockwise from the X axis about the origin. It is supposed that H0 detects the X axis component of the magnetic field as a positive sign output (+Vx) and H180 detects the X axis component of the magnetic field as a negative sign output (−Vx) at this time. In the same way, it is supposed that H90 detects the Y axis component of the magnetic field as a positive sign output (+Vy) and H270 detects the Y axis component of the magnetic field as a negative sign output (−Vy). It is supposed that all of the four Hall elements detect the Z axis component of the magnetic field by regarding a direction of incidence on the XY plane as a positive sign output (+Vz).

Therefore, signals HVX and HVY detected respectively as a difference between the output of H0 and the output of H180 and a difference between the output of H90 and the output of H270 become $$HVX = +Vx + Vz - (-Vx + Vz) = 2Vx \quad (1)$$

$$HVY = +Vy + Vz - (-Vy + Vz) = 2Vy \quad (2)$$

In other words, the signals HVX and HVY represent the X axis component and the Y axis component of a magnetic field strength, respectively. The Z axis component is canceled and is not detected.

The rotation angle sensor calculates the angle θ of the magnetic field from HVX and HVY as $$\theta = a\tan(HVY/HVX) \quad (3)$$

The reason why the angle is calculable in this way is that the magnetic field strength under the magnetic flux concentrator with respect to the rotating magnetic field exhibits an ideal sinusoidal change.

FIG. 4 is a block configuration diagram illustrative of signal processing in the rotation angle sensor described in PTL 1. The rotation angle sensor includes the Hall elements H0, H180, H90 and H270, an X axis subtraction unit 11X for subtracting detection signals of H0 and H180, a Y axis subtraction unit 11Y for subtracting detection signals of H90 and H270, and an arithmetic operation unit 12 for calculating the angle from an output (Expression (1)) of the X axis subtraction unit 11X and an output (Expression (2)) of the Y axis subtraction unit 11Y by using Expression (3).

PTL 2 describes an angle calculation technique. The angle calculation technique does not use the XY coordinate system described above. In plural Hall elements arranged under a circumference of a magnetic flux concentrator at equal intervals, an angle is calculated from outputs from two adjacent Hall elements differing in signal output sign.

Such a rotation angle sensor poses a problem of an error between the calculated angle and an angle of a rotating magnetic field to be detected caused by offsets of the Hall elements, offsets of amplifiers for amplifying signals fed from the Hall elements, or a difference in gain between the X axis and the Y axis. Several solutions have been presented. PTL 3, for example, reduces the offsets of the Hall elements by arranging the Hall elements under the magnetic flux concentrator to yield reflected image relations. PTL 4, for example, reduces the angle error by performing coordinate conversion on an X component signal and a Y component signal detected respectively by magnetic sensors arranged on the X axis and the Y axis.

Further, PTL 5, for example, discloses a technique for reducing an angle error generated by the magnetic field distortion of an external magnet. A rotation angle sensor described in PTL 5 reduces an error of an MR (i.e., magnetic resistance) element or an error caused by a magnetic field distortion of the external magnet.

Moreover, PTL 6, for example, discloses a technique of computing each axis component by using a magnetic flux concentrator and at least two Hall elements.

CITATION LIST

Patent Literature

PTL 1: US 2002/0021124 (A1)
PTL 2: U.S. Pat. No. 7,235,968 (B2)
PTL 3: JP 2012-150003 A
PTL 4: JP 2010-190872 A
PTL 5: JP 2011-158488 A
PTL 6: JP 2004-257995 A

SUMMARY OF INVENTION

Technical Problem

In a rotation angle measurement apparatus using a magnetic flux concentrator and Hall elements which is an object of the present invention, attention has to be paid to the properties of the magnetic flux concentrator.

In a weak magnetic field, the magnetic flux concentrator is gradually magnetized linearly in relation to an applied magnetic field. In a case where a magnetic field having at least a certain strength is applied, however, the magnetic flux concentrator is not magnetized linearly any longer. For convenience, such a point beyond which the magnetization is not performed linearly is defined as a magnetic saturation point. A phenomenon that the magnetization is not performed linearly is defined as the magnetic saturation (phenomenon).

FIG. 5 is a diagram illustrative of changes of the magnetic field strength under the circumference of the magnetic flux concentrator, when magnetic fields of 50 mT and 100 mT are applied to the magnetic flux concentrator having a magnetic saturation point of 70 mT, at an angle from 0 degree to 360 degrees with respect to the application direction. In FIG. 5, the magnetic field strength in 0 degree direction (i.e., parallel to the applied magnetic field) is standardized as 1. As is apparent from FIG. 5, the magnetic field strength under the magnetic flux concentrator forms an ideal sine wave (i.e., cosine wave) with respect to the angle from the magnetic field (i.e., rhomb plots and a line coupling them in FIG. 5), when a magnetic field of 50 mT not higher than the magnetic saturation point is applied. When a magnetic field of 100 mT not lower than the magnetic saturation point is applied, however, a distorted sine wave (i.e., square plots and a line coupling them in FIG. 5) is obtained.

Accordingly, when such a magnetic field not lower than the magnetic saturation point is rotated, the change of the magnetic field does not become an ideal sine wave. Therefore, an error is caused in the calculated angle by the rotation angle measurement apparatus described above.

FIG. 6 is a diagram illustrative of simulation results of an angle error included in an angle calculated by the rotation angle sensor, when the rotating magnetic field of 100 mT not lower than the magnetic saturation point described above is applied.

As is apparent from FIG. 6, the angle error becomes minimum (near 0 degree) every 45 degrees, such as at 0 degree, 45 degrees and 90 degrees. The angle error exhibits a waveform (hereafter, referred to as quadruple wave of angle error) having four positive error peaks and four negative error peaks every revolution, i.e., every 360 degrees. This angle error is generated by the magnetic saturation of the magnetic flux concentrator. In the rotation angle measurement apparatus having high accuracy and high reliability, it is important to prevent an increase of the angle error caused by the magnetic saturation and also important to detect an occurrence of the magnetic saturation. The occurrence of the magnetic saturation is a failure, for example, same as deviation of a magnet attached to a rotating shaft from its original position or deviation of the rotating shaft, and is not desirable for a user of the rotation angle measurement apparatus. Even if the magnetic saturation is detectable, an increase of the angle error is also undesirable from a viewpoint of control. For example, in a case of the rotation angle measurement apparatus for motor control, an angle error will lead to a torque ripple.

However, none of PTL 1 to PTL 6 described above discloses any of devices or methods for reducing the angle error generated by such a magnetic saturation phenomenon. Besides, it is impossible to reduce the angle error caused by the magnetic saturation of the magnetic flux concentrator by using the apparatuses and methods described in PTL 1 to PTL 6. Furthermore, none of PTL 1 to PTL 6 discloses even a technique for detecting the magnetic saturation.

In particular, these years, in the automobile field of the power steering systems and the like, the functional safety is required in conformity with ISO 26262. In order to conform to ISO 26262, the inventors of the present invention have found out that the rotation angle measurement apparatus for use in the automobile field must be robust against a failure of the rotating magnet or the like. That is to say, the inventors of the present invention have found out another object to prevent the accuracy degradation, if the magnetic saturation of the magnetic flux concentrator occurs caused by the malfunction of the rotating magnet.

The present invention has been made in view of the above problems, and has an object to provide a rotation angle measurement apparatus capable of preventing the accuracy degradation caused by the magnetic saturation of the magnetic flux concentrator, in the rotation angle measurement apparatus that uses the magnetic flux concentrator.

Solution to Problem

The present invent has been made in view of the above problems, according to an aspect of the present invention, there is provided a rotation angle measurement apparatus comprising: a plurality of Hall element pairs; a magnetic flux concentrator provided on magnetosensitive planes of the plurality of Hall element pairs; a rotating magnet arranged in proximity to the magnetic flux concentrator to cover the magnetic flux concentrator in a planer view; and an angle calculation unit configured to calculate a plurality of pieces of rotation angle information of the rotating magnet based upon output signals from a plurality of sets of the plurality of Hall element pairs.

In the above rotation angle measurement apparatus, the above rotation angle measurement apparatus may further comprise a rotation angle information correction unit configured to correct the rotation angle information in consideration of the plurality of pieces of rotation angle information. The rotation angle information correction unit may calculate an average value from the plurality of pieces of rotation angle information. The rotation angle information correction unit may calculate an added value from the plurality of pieces of rotation angle information. The rotation angle information correction unit may calculate a center value from the plurality of pieces of rotation angle information. The above rotation angle measurement apparatus may further comprise a failure detection unit configured to detect a failure of the rotation angle measurement apparatus based upon outputs from the angle calculation unit. The failure detection unit may detect the failure of the rotation angle measurement apparatus based upon the outputs from the angle calculation unit and a reference signal that is output from a reference signal output unit. The failure detection unit may detect the failure of the rotation angle measurement apparatus based upon a difference between two pieces of the plurality of pieces of rotation angle information and the reference signal. The failure detection unit may detect magnetic saturation of the magnetic flux concentrator. The rotation angle measurement apparatus may further comprise a difference calculation unit configured to calculate the difference.

In the above rotation angle measurement apparatus, when a polar coordinate is defined on the magnetic flux concentrator, the plurality of Hall element pairs may be arranged at positions of coordinate axes of an integral multiple of 90°/N, where N is an integer of 2 or more, with the origin of the polar coordinate being as a reference. The plurality of Hall element pairs may be arranged at intervals of 45 degrees under a circumference of the magnetic flux concentrator with the origin of the polar coordinate being as the reference. The plurality of Hall element pairs may be arranged to at intervals of 30 degrees under a circumference of the magnetic flux concentrator with the origin of the polar coordinate being as the reference. The plurality of sets of the plurality of Hall element pairs may include at least three sets, and the failure detection unit may calculate at least two differences, each of which is a difference between two pieces of the plurality of pieces of rotation angle information, and may detect the failure of the rotation angle measurement apparatus based upon the at least two differences and a reference signal that is output from a reference signal output unit. The failure detection unit may compare the at least two differences with the reference signal, output signals each indicating whether or not the rotation angle measurement apparatus has the failure, and determine that the rotation angle measurement apparatus has the failure, when at least one of the signals indicates the failure. When a polar coordinate is defined on the magnetic flux concentrator, two Hall element pairs of the plurality of Hall element pairs may be arranged to interpose coordinate axes of an integral multiple of 90°/N, where N is an integer of 2 or more, with the origin of the polar coordinate being as a reference. The rotation angle measurement apparatus may further comprise an amplitude calculation unit configured to calculate a plurality of pieces of amplitude information based upon the output signals from the plurality of sets of the plurality of Hall element pairs, the output signals corresponding to the plurality of pieces of rotation angle information. The rotation angle measurement apparatus may further comprise a failure detection unit configured to detect the failure of the rotation angle measurement apparatus based upon outputs from the amplitude calculation unit. The failure detection unit may detect the failure of the rotation angle measurement apparatus based upon the plurality of pieces of amplitude information and a second reference signal that is output from a second reference signal output unit. The failure detection unit may compare a difference between two pieces of amplitude information of the plurality of pieces of amplitude information with the second reference signal to detect the failure of the rotation angle measurement apparatus.

The above rotation angle measurement apparatus may further comprise an amplitude calculation unit configured to calculate a plurality of pieces of amplitude information based upon the output signals from the plurality of sets of the plurality of Hall elements pairs corresponding to the plurality of pieces of rotation angle information, wherein the failure detection unit may detect the failure of the rotation angle measurement apparatus based upon the plurality of pieces of amplitude information. In the above rotation angle measurement apparatus, the failure detection unit may detect the failure of the rotation angle measurement apparatus based upon the plurality of pieces of amplitude information and a second reference signal that is output from a second reference signal output unit. The failure detection unit may compare a difference between two pieces of amplitude information of the plurality of pieces of amplitude information with the second reference signal to detect the failure of the rotation angle measurement apparatus. The failure detection unit may output a first failure determination signal indicating whether or not the rotation angle measurement apparatus has the failure based upon the outputs from the angle calculation unit, output a second failure determination signal indicating whether or not the rotation angle measurement apparatus has the failure based upon the plurality of pieces of amplitude information, and determine that the rotation angle measurement apparatus has the failure when at least one of the first failure determination signal and the second failure determination signal indicates the failure. The failure determination unit may detect the failure of the rotation angle measurement apparatus based upon the plurality of pieces of amplitude information, a second reference signal that is output from a second reference signal output unit, and a third reference signal that is output from a third reference signal output unit. The failure determination unit may compare first amplitude information of the plurality of pieces of amplitude information with the second reference signal, and may compare second amplitude information of the plurality of pieces of amplitude information different from the first amplitude information with the third reference signal to detect the failure of the rotation angle measurement apparatus. The failure detection unit may output a first failure determination signal indicating whether or not the rotation angle measurement apparatus has the failure based upon the outputs from the angle calculation unit, may output a second failure determination signal indicating whether or not the rotation angle measurement apparatus has the failure based upon the first amplitude information, may output a third failure determination signal indicating whether or not the rotation angle measurement apparatus has the failure based upon the second amplitude information, and may determine that the rotation angle measurement apparatus has the failure when at least one of the first to third failure determination signals indicates the failure. The failure detection unit may further comprise a determination unit configured to output a first failure determination signal indicating whether or not the rotation angle measurement apparatus has the failure based upon the outputs from the angle calculation unit, and output a second failure determination signal indicating whether or not the rotation angle measurement apparatus has the failure based upon the plurality of pieces of amplitude information, to determine magnetic saturation of the magnetic flux concentrator and determine a failure of the plurality of Hall element pairs based upon one piece of the plurality of pieces of rotation angle information, a difference between two pieces of the plurality of pieces of rotation angle information, a difference between two pieces of the plurality of pieces of rotation amplitude information, the first failure determination signal, and the second failure determination signal.

According to another aspect of the present invention, there is provided a rotation angle information output apparatus comprising: a plurality of Hall elements; a magnetic flux concentrator provided on magnetosensitive planes of the plurality of Hall elements; a rotating magnet arranged in proximity to the magnetic flux concentrator to cover the magnetic flux concentrator in a planer view; and an angle information output unit configured to output a plurality of pieces of rotation angle information of the rotating magnet.

The above rotation angle information output apparatus may further comprise a failure information output unit configured to output failure information when at least apart of the rotation angle information output apparatus has a failure. In the above rotation angle information output apparatus, the failure information output unit may output the failure information when magnetic saturation occurs at the magnetic flux concentrator.

In the above rotation angle information output apparatus, the failure information output unit may output the failure information when at least one of the plurality of Hall elements has a failure.

According to further another aspect of the present invention, there is provided a duplex output system of rotation angle information, comprising: a plurality of Hall elements; a magnetic flux concentrator which is provided on magnetosensitive planes of the plurality of Hall elements and to which a rotating magnet is arranged in proximity; and a duplex angle information output unit configured to output duplex rotation angle information of the rotating magnet.

The above duplex output system of rotation angle information may further comprise a failure information output unit configured to output failure information, when at least a part of the duplex output system of rotation angle information has a failure. In the above duplex output system of rotation angle information, the failure information output unit may output the failure information, when magnetic saturation occurs at the magnetic flux concentrator. The failure information output unit may output the failure information, when at least one of the plurality of Hall elements has a failure.

According to yet another aspect of the present invention, there is provided a functional safety system comprising: a plurality of Hall elements; a magnetic flux concentrator which is provided on magnetosensitive planes of the plurality of Hall elements and to which a rotating magnet is arranged in proximity; and a functional safety angle information output unit configured to output rotation angle information of the rotating magnet in functional safety.

The above functional safety system may further comprise a failure information output unit configured to output failure information, when at least a part of the functional safety system has a failure. In the above functional safety system, the failure information output unit may output the failure information, when magnetic saturation occurs at the magnetic flux concentrator. The failure information output unit may output the failure information, when at least one of the plurality of Hall elements has a failure.

According to yet another aspect of the present invention, there is provided a system in conformity with ISO 26262 comprising: a plurality of Hall elements; a magnetic flux concentrator which is provided on magnetosensitive planes of the plurality of Hall elements and to which a rotating magnet is arranged in proximity; and an angle information output unit in conformity with ISO 26262 configured to output rotation angle information of the rotating magnet in conformity with ISO 26262.

The above system in conformity with ISO 26262 may further comprise a failure information output unit configured to output failure information, when at least a part of the system in conformity with ISO 26262 has a failure. In the above system in conformity with ISO 26262, the failure information output unit may output the failure information, when magnetic saturation occurs at the magnetic flux concentrator.

In the above system in conformity with ISO 26262, the failure information output unit may output the failure information, when at least one of the plurality of Hall elements has a failure.

Advantageous Effects of Invention

The present invention provides a rotation angle measurement apparatus using a magnetic flux concentrator and capable of preventing the accuracy degradation caused by the magnetic saturation of the magnetic flux concentrator. Even if a magnetic field strength is strong and the magnetic saturation of the magnetic flux concentrator occurs, it becomes possible to calculate the angle with high accuracy. The effects brought about by the present invention are very useful especially in rotation angle sensors used in applications requiring strict safety, such as in-vehicle use.

BRIEF DESCRIPTION OF DRAWINGS

FIG. 10A is a configuration diagrams illustrative of a signal processing circuit in the rotation angle measurement apparatus according to the first embodiment of the present invention;

DESCRIPTION OF EMBODIMENTS

Hereafter, embodiments of the present invention will be described with reference to the drawings.

A first embodiment will be described as to a case where two coordinate systems are used. A second embodiment will be described as to a case where three coordinate systems are used.

First Embodiment

Figure 7:
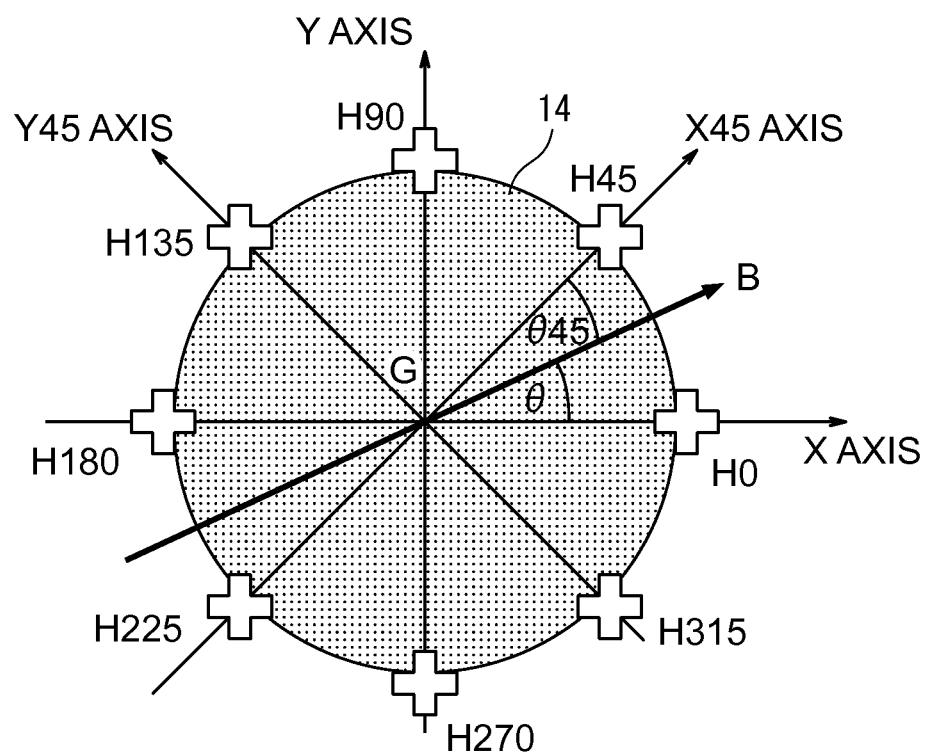
FIG. 7 is a diagram illustrative of arrangement of Hall elements in a rotation angle measurement apparatus according to a first embodiment of the present invention.

FIG. 7 is a diagram illustrative of arrangement of Hall elements in a rotation angle measurement apparatus according to the first embodiment of the present invention. Plural Hall elements H0, H45, H90, H135, H180, H225, H270 and H315 are arranged under a circumference of a circular magnetic flux concentrator 14, at intervals of 45 degrees counterclockwise. Among the plural Hall elements H0, H45, H90, H135, H180, H225, H270, and H315, H0 and H180 form a Hall element pair, H45 and H225 form a Hall element pair, H90 and H270 form a Hall element pair, and H135 and H315 form a Hall element pair. The circular magnetic flux concentrator 14 is arranged on magnetosensitive planes of the plural Hall element pairs. In addition, the rotating magnet is arranged in proximity to the magnetic flux concentrator 14 to cover the magnetic flux concentrator 14 in a planar view.

Figure 1:
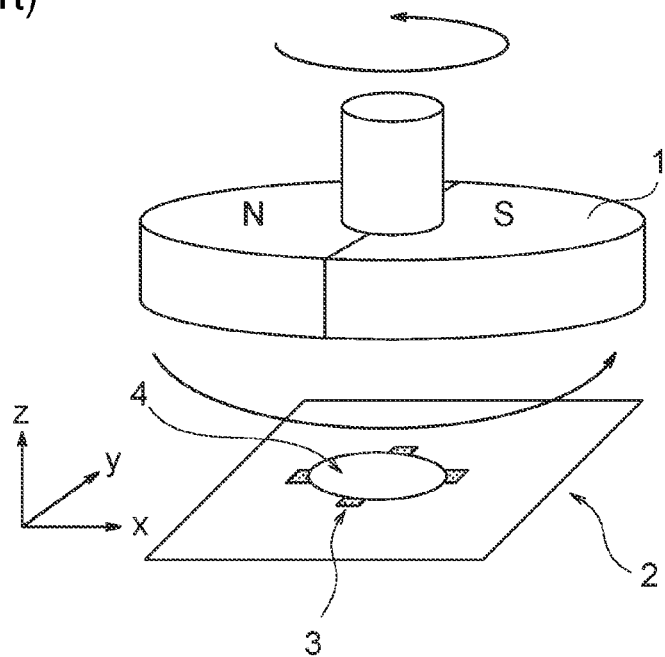
FIG. 1 is a configuration diagram illustrative of a rotation angle sensor described in PTL 1.
Figure 2:
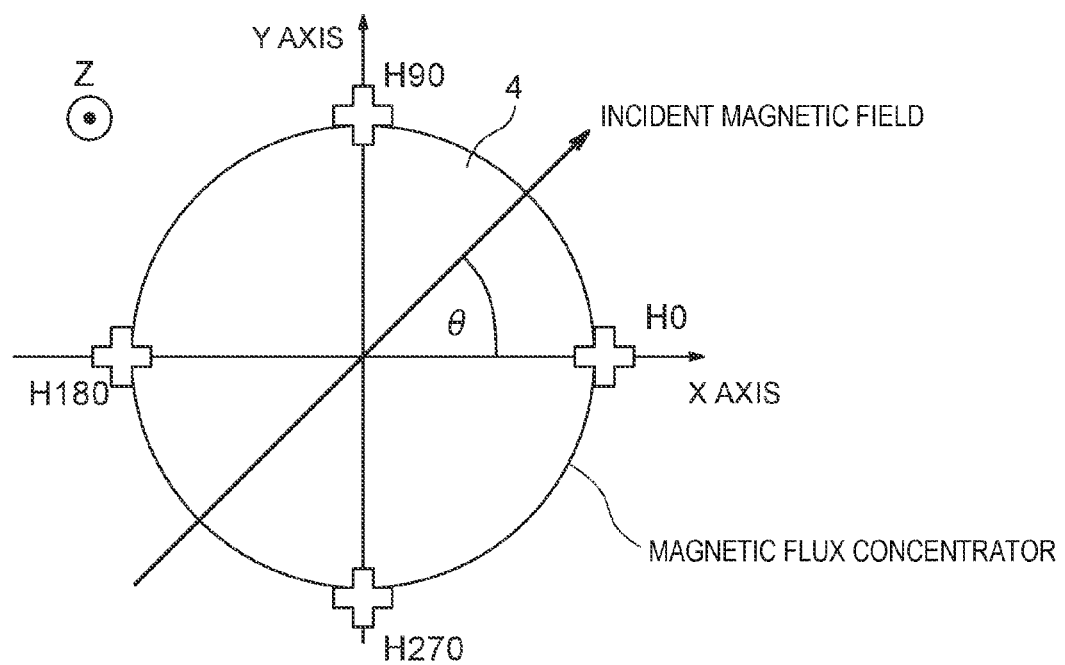
FIG. 2 is a diagram illustrative of arrangement of Hall elements and a magnetic flux concentrator formed on a silicon substrate as illustrated in FIG. 1.
Figure 3:
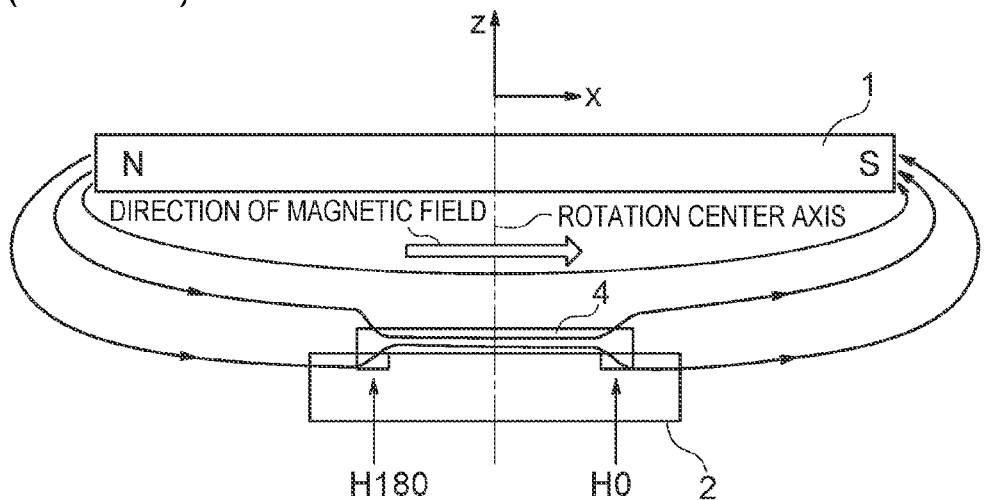
FIG. 3 is a cross-sectional view illustrative of a rotating magnet, the magnetic flux concentrator, the Hall elements, and the silicon substrate illustrated in FIG. 1 taken along an X axis direction.
Figure 4:
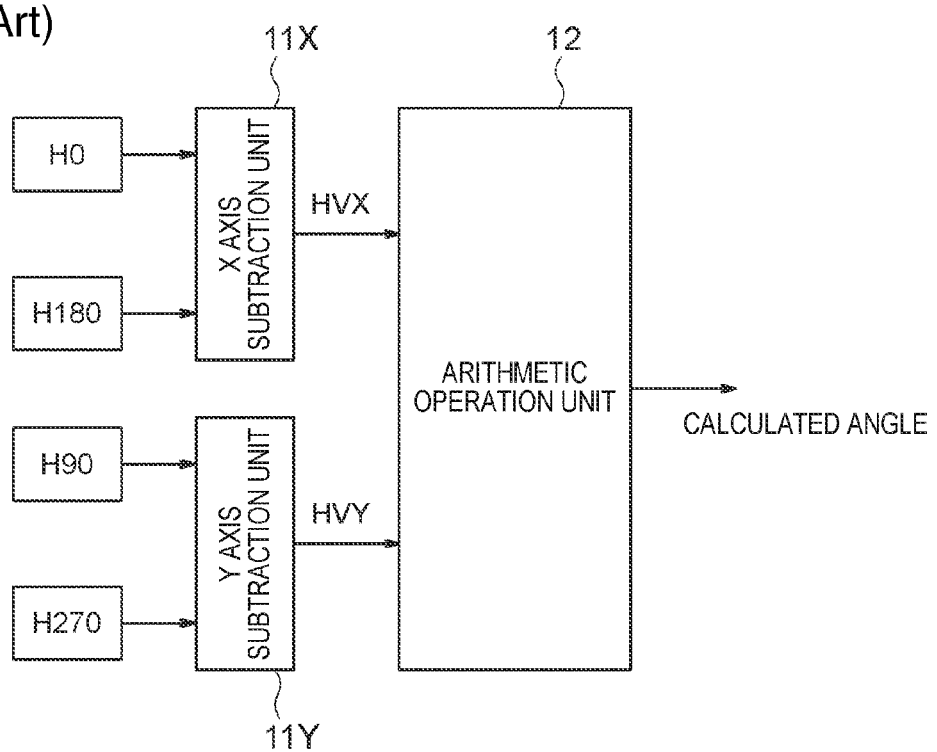
FIG. 4 is a block configuration diagram illustrative of signal processing in the rotation angle sensor described in PTL 1.
Figure 5:
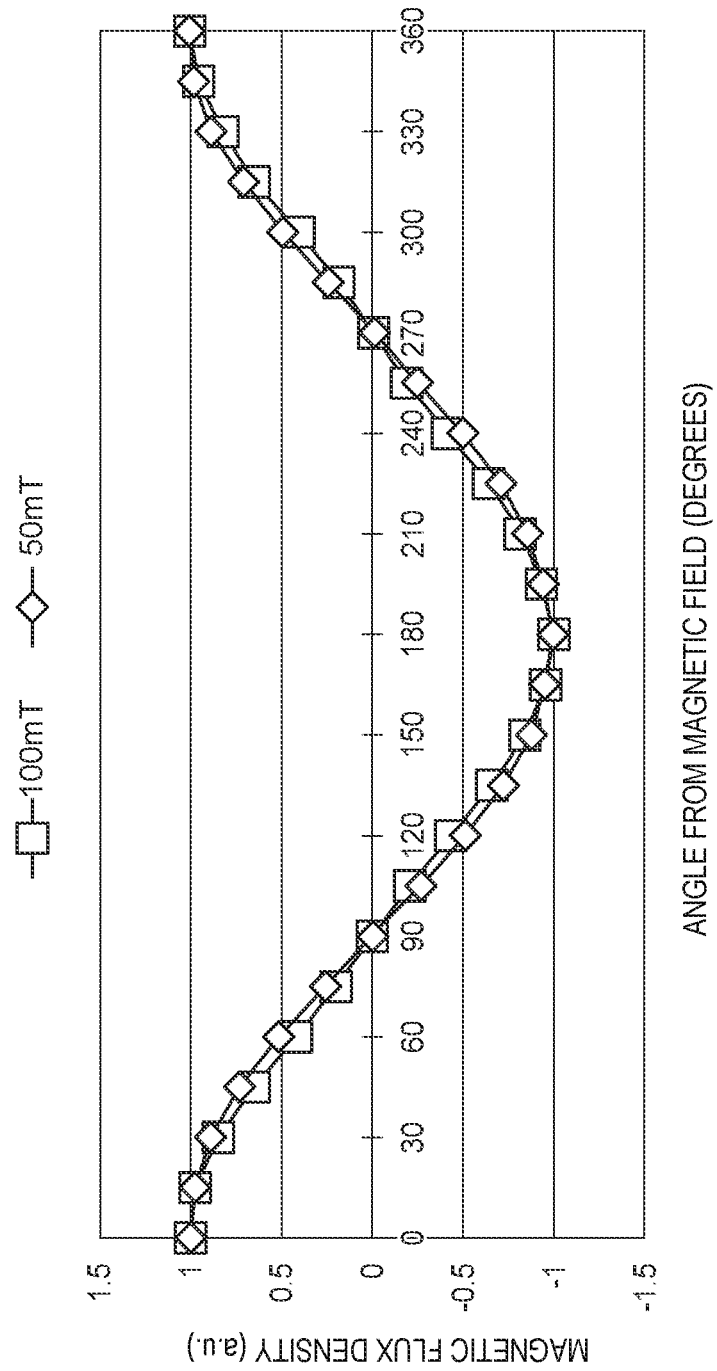
FIG. 5 is a diagram illustrative of changes of a magnetic field strength under a circumference of a magnetic flux concentrator when magnetic fields of 50 mT and 100 mT are applied to the magnetic flux concentrator having a magnetic saturation point of 70 mT.

A center point G of the circular magnetic flux concentrator 14 is also a middle point of the Hall element pair H0 and H180, the Hall element pair H45 and H225, the Hall element pair H90 and H270, and the Hall element pair H135 and H315. If an X axis is formed on a straight line directed from H180 toward H0 and a Y axis is formed on a straight line directed from H270 toward H90, it is possible to form the same XY coordinate system as the XY coordinate system of the related art illustrated in FIG. 2. On the other hand, if an X45 axis is formed on a straight line directed from H225 toward H45, and a Y45 axis is formed on a straight line directed from H315 toward H135, an XY45 coordinate system which is the XY coordinate system rotated counterclockwise around G by 45 degrees is obtained.

In other words, plural Hall element pairs are arranged at positions of coordinate axes in coordinate systems of integer times of 90°/N. In this case, N=2 and the plural Hall element pairs are arranged at positions of coordinate axes in coordinate systems of 0 time and 1 time of 90°/N. Furthermore, it is desirable that the plural Hall element pairs are arranged under the circumference of the magnetic flux concentrator at intervals of 45 degrees.

In the same way as the related art, a difference between the output of H0 and the output of H180 becomes an output signal (HVX) representing an X component of a magnetic field. A difference between the output of H90 and the output of H270 becomes an output signal (HVY) representing a Y component of the magnetic field. In the same way, a difference between the output of H45 and the output of H225 becomes an output signal (HVX45) representing an X45 component of the magnetic field. A difference between the output of H135 and the output of H315 becomes an output signal (HVY45) representing a Y45 component of the magnetic field.

An arrangement of the Hall elements H0, H90, H180 and H270 constituting the XY coordinate system is referred to as arrangement A. An arrangement of the Hall elements H45, H135, H225 and H315 constituting the XY45 coordinate system is referred to as arrangement B.

Supposing that a magnetic field B is incident on the magnetic flux concentrator in a direction of θ counterclockwise from the X axis around the origin and signal amplitude representing a magnetic field strength is $V_B$, the following expressions are obtained.

$$HVX = V_B \cos θ$$

$$HVY = V_B \sin θ$$

On the other hand, supposing that the magnetic field B is incident in a direction of θ45 clockwise from the X45 axis, the following expressions are obtained.

$$HVX45 = V_B \cos θ45$$

$$HVY45 = V_B \sin θ45$$

The angles θ and θ45 are represented by the following expressions, respectively.

$$θ = a\tan(HVY/HVX)$$

$$θ45 = a\tan(HVY45/HVX45)$$

Here, θ and θ45 in a case where there is no angle error are defined as θideal and θ45ideal, respectively.

The XY45 coordinate system is obtained by rotating the XY coordinate system counterclockwise by 45 degrees. Supposing that an angle obtained by adding 45° to θ45 is θc, θc becomes equal to θideal in a case where there is no angle error. In other words, $$θc = θ45 + 45°$$

$$θc\_ideal = θ45ideal + 45° = θideal$$

Supposing that the magnetic saturation generates an angle error Δθ in the XY coordinate system and an angle error Δθ45 in the XY45 coordinate system, it follows that $$θ = θideal + Δθ$$

$$θ45 = θ45ideal + Δθ45$$

Then, $$θc = θ45 + 45° = θ45ideal + Δθ45 + 45° = θideal + Δθ45$$

is satisfied.

An angle error of θc is Δθ45.

Figure 8:
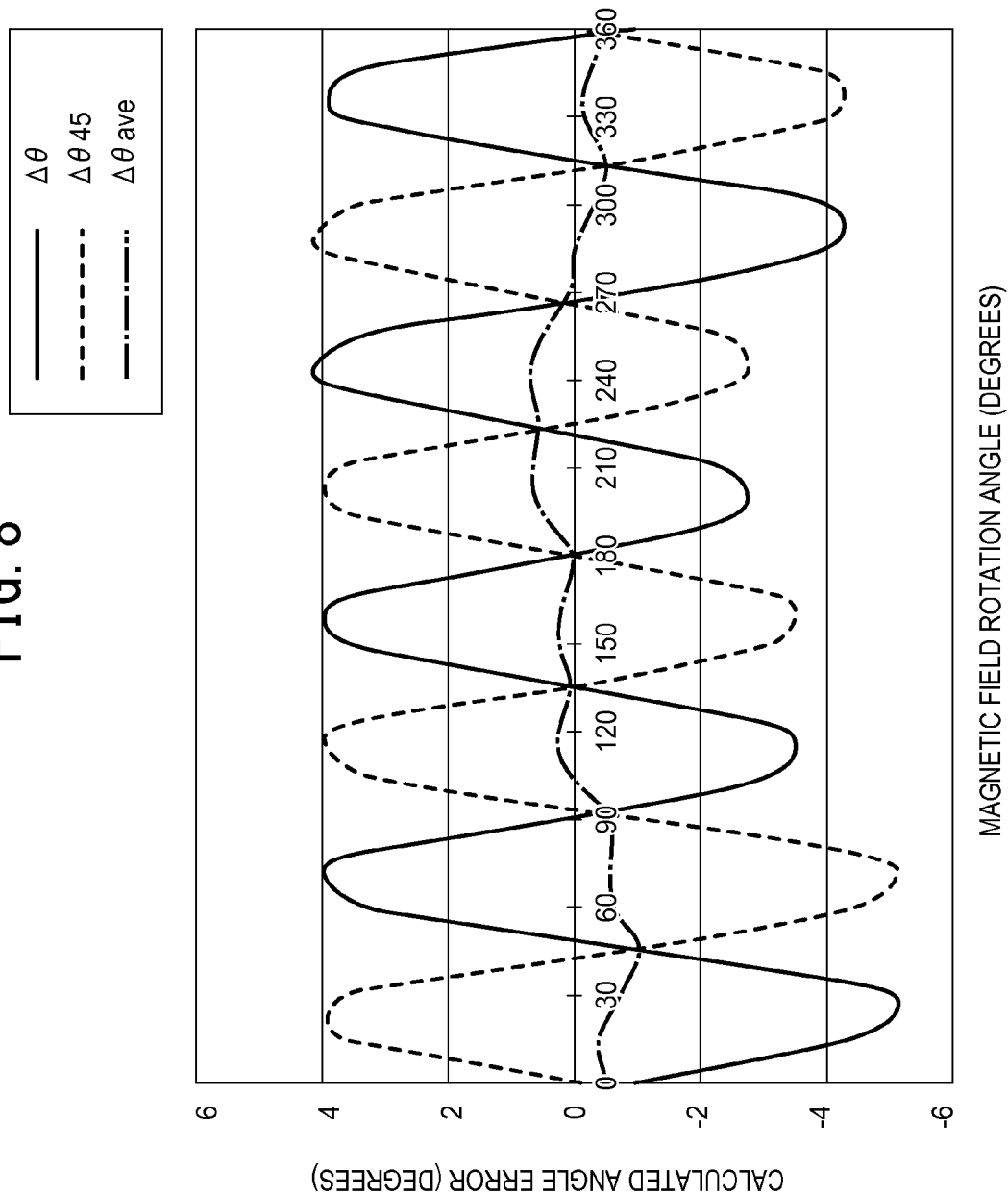
FIG. 8 is a diagram illustrative of simulation results of angle errors Δθ and Δθ45 included in angles calculated by the rotation angle measurement apparatus when a rotating magnetic field of 100 mT not lower than the magnetic saturation point 70 mT is applied to a magnetic flux concentrator in the rotation angle measurement apparatus illustrated in FIG. 7.

FIG. 8 is a diagram illustrative of simulation results of the angle errors Δθ and Δθ45 included in the angles calculated by the rotation angle measurement apparatus when a rotating magnetic field of 100 mT not lower than the magnetic saturation point 70 mT is applied to the magnetic flux concentrator in the rotation angle measurement apparatus illustrated in FIG. 7.

Figure 6:
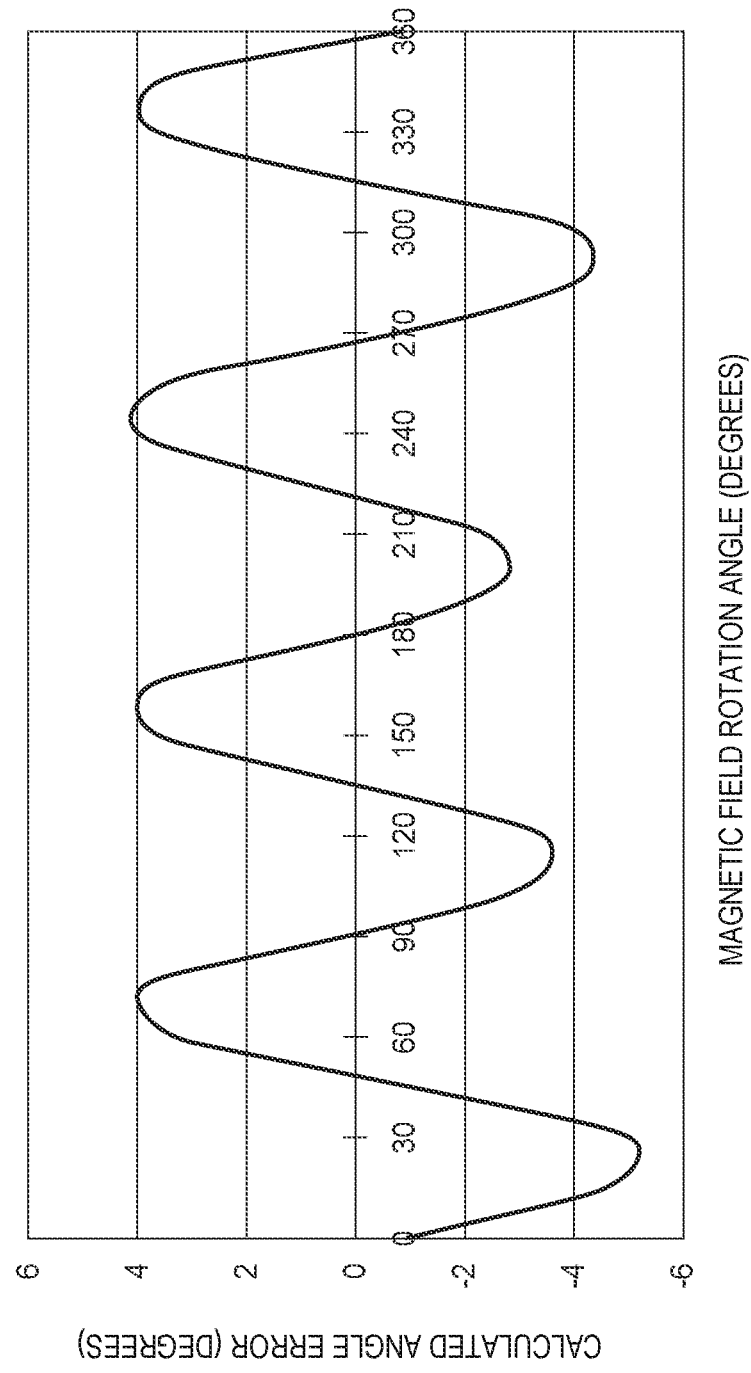
FIG. 6 is a diagram illustrative of simulation results of an angle error included in an angle calculated by a rotation angle measurement apparatus when the rotating magnetic field of 100 mT not lower than the magnetic saturation point is applied.

The angle error Δθ calculated based upon the Hall elements in the arrangement A with respect to the angle of the magnetic field is represented by a solid line in FIG. 8. The angle error Δθ forms a quadruple wave in the same way as FIG. 6. On the other hand, the angle error Δθ45 of θc obtained by adding 45° to the angle θ45 calculated based upon the Hall elements in the arrangement B forming the XY45 coordinate system is represented by a dashed line in FIG. 8. The angle error Δθ45 forms a quadruple wave in the same way as Δθ. However, the quadruple wave of the angle error Δθ45 has an inverted polarity as compared with the quadruple wave of the angle error Δθ. This is because the angle error Δθ45 measured by the XY45 coordinate system is shifted in phase as compared with the angle error Δθ by 4×45°=180°. TABLE 1 is a table illustrative of polarities of Δθ and Δθ45 in each angle range.

TABLE 1

| | ① | ② | ③ | ④ | ⑤ | ⑥ | ⑦ | ⑧ |
|---|---|---|---|---|---|---|---|---|
| ANGLE RANGE | 0° < θ < 45° | 45° < θ < 90° | 90° < θ < 135° | 135° < θ < 180° | 180° < θ < 225° | 225° < θ < 270° | 270° < θ < 315° | 315° < θ < 360° |
| Δθ | − | + | − | + | − | + | − | + |
| Δθ45 | + | − | + | − | + | − | + | − |

It is to be appreciated that the polarities of the angle errors are opposite to each other in any angle range. Therefore, it follows that $$Δθ + Δθ45 ≈ 0$$

In other words, the XY45 coordinate system has an arrangement generating an angle error that cancels the angle error generated by the XY coordinate system.

An average value θave of θ and θc becomes $$θave = (θ + θc)/2 = (θideal + Δθ + θideal + Δθ45)/2 ≈ θideal$$

Even if an angle error is generated by the magnetic saturation, it is possible to obtain the angle in the XY coordinate system with high accuracy. In other words, highly accurate angle measurement of a magnetic field is achieved by calculating an angle in the XY coordinate system and calculating an angle in the XY45 coordinate system and correcting the rotation angle information of the rotating magnet from plural pieces of rotation angle information θ, θc (i.e., arithmetic averaging in the above example). A dot dash line in FIG. 8 indicates a residual error Δθave of θave. It is to be appreciated that the residual error Δθave is obviously reduced as compared with Δθ and Δθ45.

Accordingly, it is possible to enlarge the input magnetic field range and measure even if the magnetic saturation occurs, while it is possible in the conventional technique to measure only in the range in which the magnetic saturation of the magnetic flux concentrator does not occur. Additionally, since the measurement is made possible, even if the magnetic saturation occurs, the strength of the magnetic field incident on the Hall elements can be increased by use of the magnetic flux concentrator having a low magnetic saturation point but a large size, so that output signals from the Hall elements can be made larger. It is thus possible to improve the Signal to Noise ratio (i.e., SN) of the rotation angle measurement apparatus.

Next, detection of the magnetic saturation which is another advantageous effect of the present embodiment will now be described.

In a case where the magnetic saturation is not caused, it is apparent that $$\Delta\theta - \Delta\theta 45 = 0$$

In a case where the magnetic saturation occurs, however, it is also apparent from the foregoing description that $$\Delta\theta - \Delta\theta 45 \neq 0$$

except vicinities of angles of K×45° (where K is an integer from 0 to 7) where the quadruple wave of the angle error becomes 0°, because Δθ and Δθ45 are different from each other in polarity as indicated in TABLE 1.

Therefore, in a case where θ and θc are calculated, a difference θd between them is $$\theta d = \theta - \theta c = \Delta\theta - \Delta\theta 45 \neq 0$$

Therefore, by predetermining a suitable threshold θd_lim, and using a relation expression $$|\theta d| < \theta d\_lim$$

(where |θd| is an absolute value of θd), the magnetic saturation is detectable when |θd| is larger than θd_lim. That is, it becomes possible to detect the magnetic saturation by using the angle θ45 calculated in the XY45 coordinate system, although it is undetectable by using only the angle θ calculated in the XY coordinate system.

Figure 9:
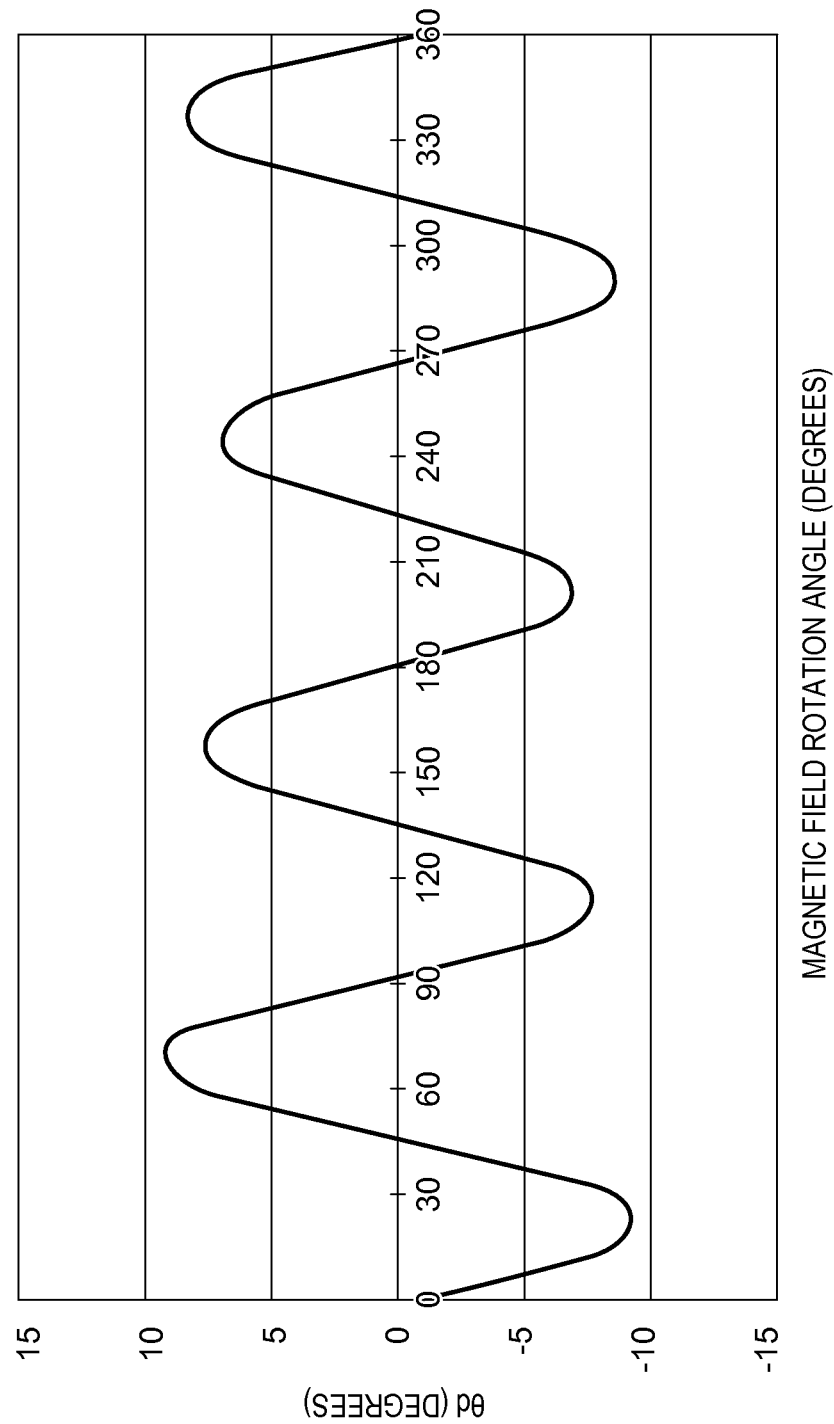
FIG. 9 is a diagram illustrative of simulation results of θd at time when a rotating magnetic field of 100 mT not lower than the magnetic saturation point 70 mT is applied to the magnetic flux concentrator in the rotation angle measurement apparatus illustrated in FIG. 7.

FIG. 9 is a diagram illustrative of simulation results of θd at time when a rotating magnetic field of 100 mT not lower than the magnetic saturation point 70 mT is applied to the magnetic flux concentrator in the rotation angle measurement apparatus illustrated in FIG. 7. It is to be appreciated that θd is not 0 because of the magnetic saturation except angles of K×45° where an angle error is not generated by the saturation originally.

FIG. 10A is a configuration diagram illustrative of a signal processing circuit in the rotation angle measurement apparatus according to the first embodiment of the present invention. The rotation angle measurement apparatus illustrated in FIG. 10A includes: a first Hall element pair 21 (H0 and H180) in the arrangement A; a second Hall element pair 22 (H90 and H270) in the arrangement A; a third Hall element pair 23 (H45 and H225) in the arrangement B; a fourth Hall element pair 24 (H135 and H315) in the arrangement B; a MUX (multiplexer) 25; an X axis subtraction unit 26X; a Y axis subtraction unit 26Y; an angle calculation unit 27; a first storage register 28a; a second storage register 28b; a rotation angle information correction unit 29; and a failure detection unit 30. The failure detection unit 30 includes a subtraction unit 31, a threshold memory 32, and a threshold comparison unit 33.

In other words, the rotation angle measurement apparatus according to the first embodiment of the present invention is a rotation angle measurement apparatus, which includes the plural Hall elements H0 to H315 provided on a substrate, and a magnetic flux concentrator 14 provided on magneto-sensitive planes of the plural Hall elements H0 to H315, and which measures a rotation angle of a rotating magnet arranged in proximity to the magnetic flux concentrator 14 to cover the magnetic flux concentrator 14 in a planer view. The rotation angle measurement apparatus according to the first embodiment of the present invention includes plural Hall element pairs constituted by the plural Hall elements H0 to H315, and specifically includes the first Hall element pair 21 (H0 and H180) for detecting a magnetic component in a first direction, the second Hall element pair 22 (H90 and H270) for detecting a magnetic component in a second direction different from the first direction, the third Hall element pair 23 (H45 and H225) for detecting a magnetic component in a third direction different from the first direction and the second direction, and the fourth Hall element pair 24 (H135 and H315) for detecting a magnetic component in a fourth direction different from the first to third directions.

The angle calculation unit 27 calculates a first rotation angle θ of the rotating magnet based upon the strengths of the output signals from the first Hall element pair 21 and the second Hall element pair 22, each of which is one of the plural Hall element pairs. In addition, the angle calculation unit 27 calculates a second rotation angle θc of the rotating magnet based upon the strengths of the output signals from the third Hall element pair 23 and the fourth Hall element pair 24, each of which is one of the plural Hall element pairs. In other words, the angle calculation unit 27 calculates plural pieces of rotation angle information of the rotating magnet, based upon the strengths of the output signals from the plural pairs of the plural Hall element pairs (i.e., the first Hall element pair 21 and the second Hall element pair 22, and the third Hall element pair 23 and the fourth Hall element pair 24). In other words, the above-described plural pairs denote one set including the first Hall element pair 21 and the second Hall element pair 22, and one set of the third Hall element pair 23 and the fourth Hall element pair 24, and also denote that plural sets, each of which is constituted by two Hall element pairs from the plural Hall element pairs, are provided for the plural pieces of rotation angle information. Herein, the strength of the output signal means the voltage of the output signal, that is, the Hall electromotive force signal that is output from the Hall element according to the input magnetic field.

Furthermore, the subtraction unit (i.e., difference calculation unit) 31 calculates a difference between the first rotation angle θ and the second rotation angle θc. The threshold comparison unit (simply referred to as a comparison unit) 33 detects a failure in the rotation angle measurement apparatus based upon an output from the subtraction unit (i.e., difference calculation unit) 31 and a reference signal that is output from the threshold memory (i.e., reference signal output unit) 32. Here, the threshold comparison unit 33 detects the magnetic saturation in the magnetic flux concentrator 14.

Further, the rotation angle information correction unit 29 corrects the rotation angle information according to the first rotation angle θ and the second rotation angle θc. In this correction, from the first rotation angle θ and the second rotation angle θc, the information on the rotation angle having a smaller error with respect to the true rotation angle is given to the information on the rotation angle having a larger error with respect to the true rotation angle, so as to output the rotation angle information closer to the true rotation angle. Such correction enlarges the dynamic range determined depending on the magnet saturation of the magnetic flux concentrator.

Figure 10B:
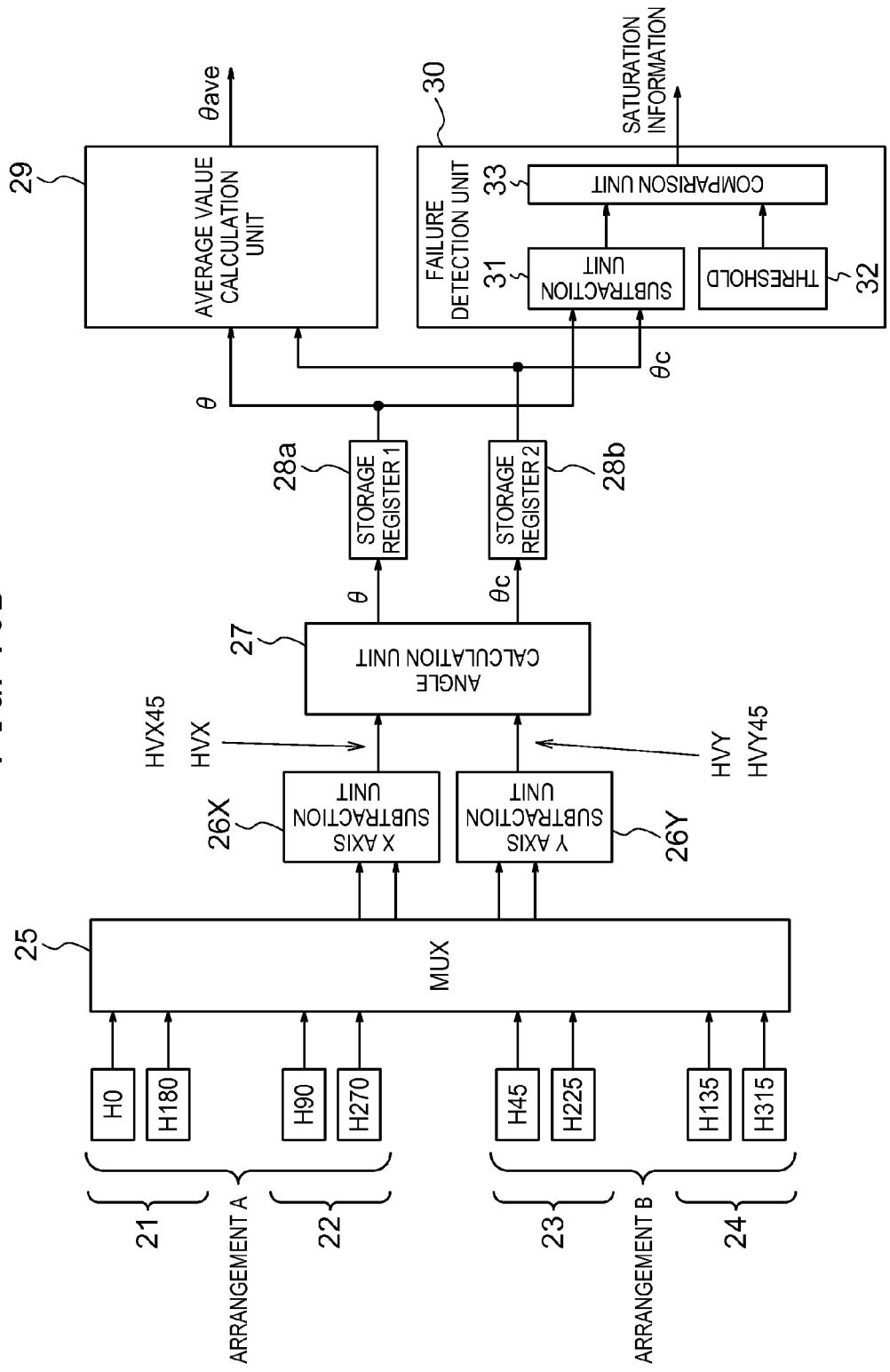
FIG. 10B is a diagram illustrative of a specific example of a rotation angle information correction unit of FIG. 10A, in a case where the rotation angle information correction unit is an average value calculation unit.
Figure 10C:
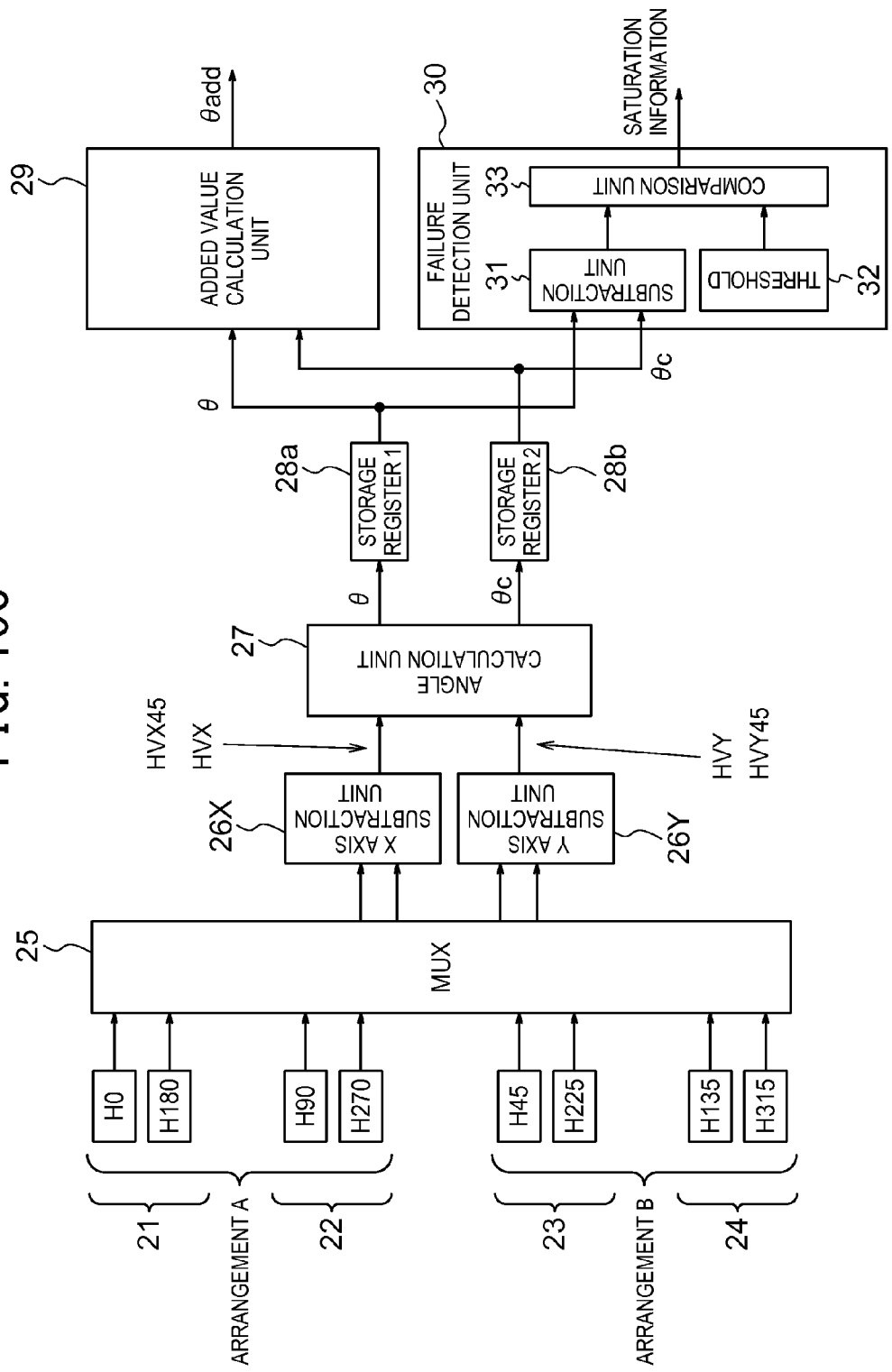
FIG. 10C is a diagram illustrative of a specific example of a rotation angle information correction unit of FIG. 10A, in a case where the rotation angle information correction unit is an added value calculation unit.
Figure 10D:
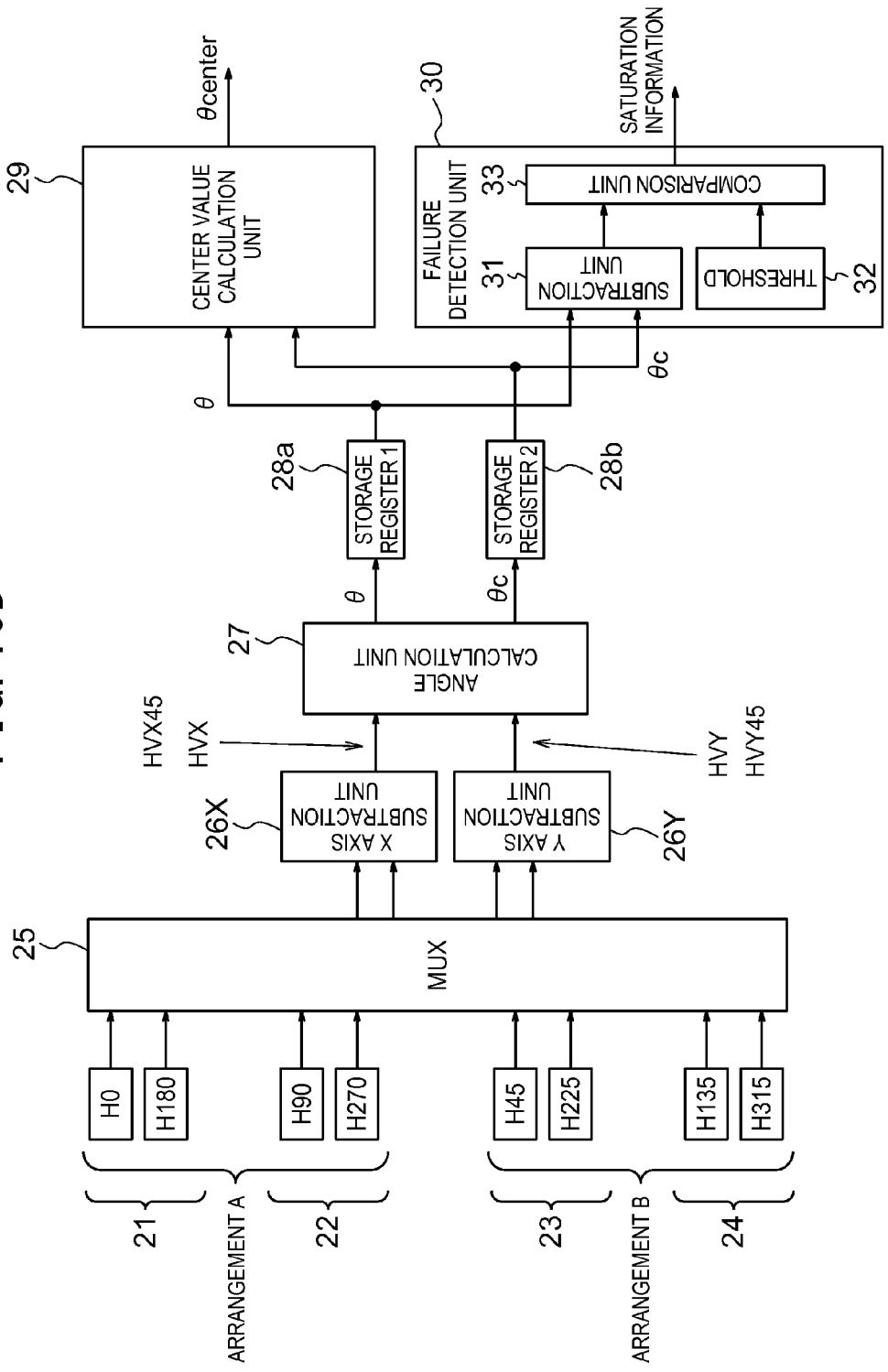
FIG. 10D is a diagram illustrative of a specific example of a rotation angle information correction unit of FIG. 10A, in a case where the rotation angle information correction unit is a center value calculation unit.

FIG. 10B to FIG. 10D are views illustrative of the rotation angle information correction unit 29 that are replaced with specific examples. In FIG. 10B, the rotation angle information correction unit is an average value calculation unit. In FIG. 10C, the rotation angle information correction unit is an added value calculation unit. In FIG. 10D, the rotation angle information correction unit is a center value calculation unit.

In FIG. 10B, the rotation angle information correction unit 29 calculates the average value θave from the first rotation angle θ and the second rotation angle θc. The average value θave is an arithmetic averaging, but a harmonic average or a geometric average may be output without limiting to the arithmetic averaging.

In FIG. 10C, the added value calculation unit 29 calculates the added value θadd from the first rotation angle θ and the second rotation angle θc and outputs the added value θadd. In this embodiment, the added value θadd is equal to approximately double the true rotation angle, and it is possible to obtain a value closer to the true rotation angle by providing a divider, attenuator, bit shifter, not illustrated, in the latter stage. In particular, when the added value θadd is represented as a digital signal, the same information to the above-described arithmetic averaging is obtainable by rounding lower bits and making higher bits available. The added value θadd can be recognized as double the true rotation angle and a half value of the added value θadd can be recognized as approximately the true rotation angle by a user of the rotation angle measurement apparatus.

In FIG. 11D, the center value calculation unit 29 calculates the center value θcenter from the first rotation angle θ and the second rotation angle θc and outputs the center value θcenter. When two pieces of rotation angle information are provided, the center value θcenter is same as the above-described arithmetic averaging. However, when three or more pieces of rotation angle information are provided, the center value is calculated and output. In this embodiment, for example, when one of plural pieces of rotation angle information has an extreme error, in other words, an abnormal value (i.e., an outlier), an influence of the abnormal value can be made very small.

Hereinafter, in all of the embodiments of the present invention, the rotation angle information correction unit 29 will be described as the average value calculation unit 29, for simplification of the description. In addition, the average means the arithmetic averaging. However, the average value calculation unit 29 may calculate not only the geometric average or the harmonic average but also the added value or the center value.

In FIG. 10B, outputs from the first Hall element pair 21 (H0 and H180) in the arrangement A, outputs from the second Hall element pair 22 (H90 and H270) in the arrangement A, outputs from the third Hall element pair 23 (H45 and H225) in the arrangement B, and outputs from the fourth Hall element pair 24 (H135 and H315) in the arrangement B are input to the MUX 25.

The MUX 25 outputs the outputs from the first Hall element pair 21 (H0 and H180) in the arrangement A to the X axis subtraction unit 26X, and outputs the outputs from the second Hall element pair 22 (H90 and H270) in the arrangement A to the Y axis subtraction unit 26Y, at time φ1. The X axis subtraction unit 26X outputs output signal HVX to the angle calculation unit 27. The Y axis subtraction unit 26Y outputs output signal HVY to the angle calculation unit 27.

The angle calculation unit 27 calculates the angle θ in the XY coordinate system and outputs the angle θ to the first storage register 28a at the time φ1. At time φ2, the MUX 25 outputs the outputs from the third Hall element pair 23 (H45 and H225) in the arrangement B to the X axis subtraction unit 26X, and outputs the outputs from the fourth Hall element pair 24 (H135 and H315) in the arrangement B to the Y axis subtraction unit 26Y. The X axis subtraction unit 26X outputs output signal HVX45 to the angle calculation unit 27. The Y axis subtraction unit 26Y outputs output signal HVY45 to the angle calculation unit 27.

The angle calculation unit 27 calculates the angle θ45 in the XY45 coordinate system and outputs the angle θc subjected to 45° correction to the second storage register 28b at the time φ2. The first storage register 28a outputs θ to the average value calculation unit 29 and the failure detection unit 30. The second storage register 28b outputs θc to the average value calculation unit 29 and the failure detection unit 30. The average value calculation unit 29 calculates θave from θ and θc. In θave, the angle error caused by the magnetic saturation is reduced.

The angles θ and θc input to the failure detection unit 30 are input to the subtraction unit 31. The subtraction unit 31 calculates θd from θ and θc, and outputs θd to the comparison unit (threshold comparison unit) 33. The comparison unit 33 determines whether the magnetic saturation has occurred based upon θd and the threshold θd_lim (reference signal) stored in the threshold memory (reference signal output unit) 32. That is, if the magnetic saturation is detected, the comparison unit 33 outputs "1". Unless the magnetic saturation is detected, the comparison unit 33 outputs "0". That is, the failure detection unit 30 detects a failure of the rotation angle measurement apparatus based upon the outputs from the angle calculation unit 27 and the threshold θd_lim stored in the threshold memory 32. The failure detection in the present embodiment is capable of detecting a failure that the rotating magnet gets closer to the magnetic flux concentrator. In other words, in the present embodiment, the magnetic saturation that is occurring can be determined, and if the magnetic saturation that is occurring is determined, the saturation information is output.

As described heretofore, it is possible in the rotation angle measurement apparatus using the magnetic flux concentrator 14 to reduce the angle error caused by the magnetic saturation in the magnetic flux concentrator 14 and detect the magnetic saturation.

The XY45 coordinate system functioning as an additional coordinate system has been obtained by rotating the XY coordinate system around G by 45°. However, the rotation angle is not limited to 45°, but may be any angle θa in the range of 0° to 90° as long as it is possible to secure areas for arranging Hall elements for an additional coordinate system. No matter what angle θa may be, it is possible in principle to carry out both reduction of the angle error and detection of the magnetic saturation.

With respect to an angle θt calculated in the additional coordinate system, θc is set to be θc=θt+θa. In the case of the angle error reduction, an angle error Δθave becomes smaller as compared with Δθ and Δθt (where Δθt is an angle error of θt) by setting θave=(θ+θc)/2

(since Δθt is a waveform differing in phase from Δθ, an average of them becomes smaller than the original waveform.)

Figure 11:
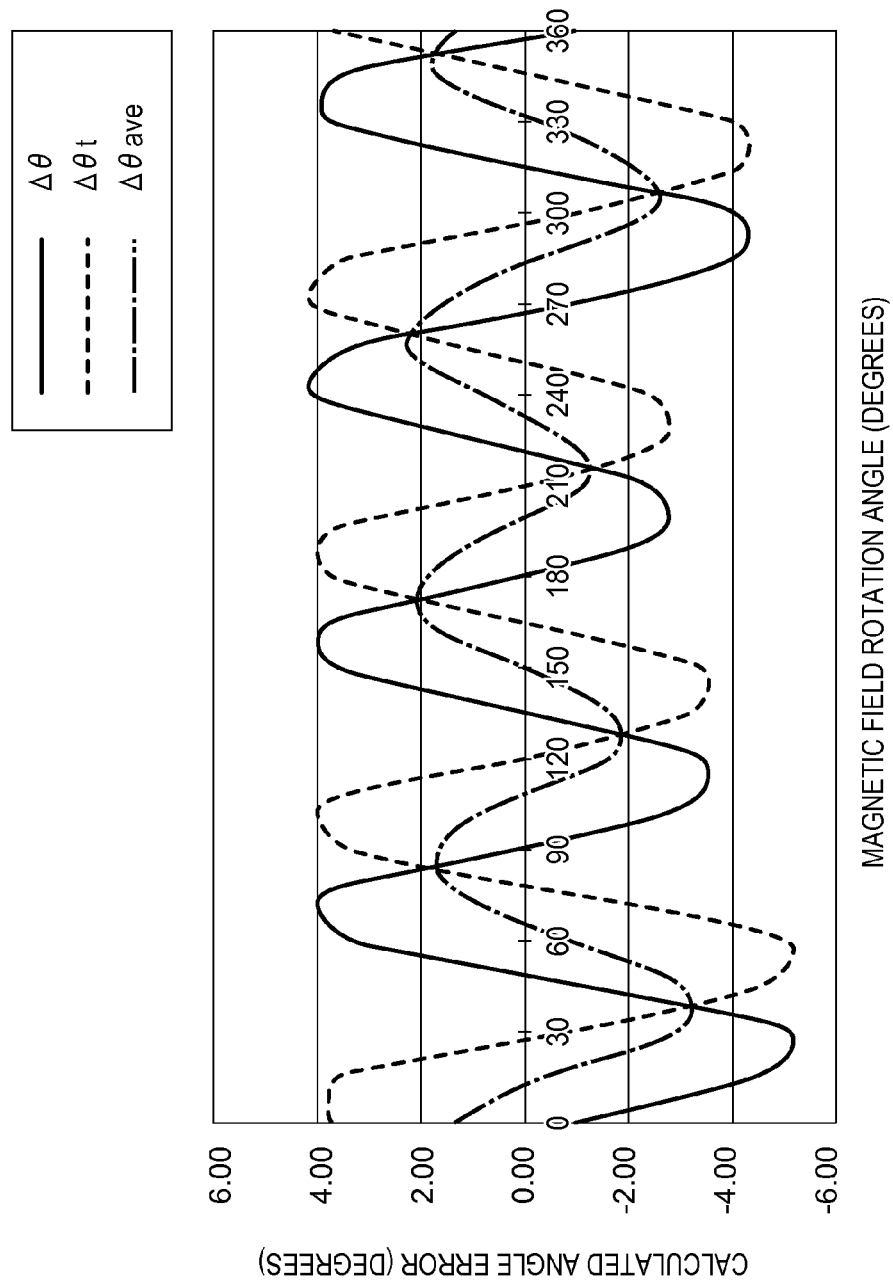
FIG. 11 is a diagram illustrative of simulation results of angle errors Δθ, Δθt and Δθave included in the angles calculated by the rotation angle measurement apparatus when a rotating magnetic field of 100 mT not lower than the magnetic saturation point is applied to the magnetic flux concentrator in a case where θa=30°.

FIG. 11 is a diagram illustrative of simulation results of angle errors Δθ, Δθt and Δθave included in the angles calculated by the rotation angle measurement apparatus when a rotating magnetic field of 100 mT not lower than the magnetic saturation point is applied to the magnetic flux concentrator in a case where θa=30°. In FIG. 11, a solid line indicates Δθ, a dashed line indicates Δθt, and a dot dash line indicates Δθave. It is to be appreciated that Δθave is reduced as compared with Δθ and Δθt.

On the other hand, in the case of detection of the magnetic saturation,

θd=θ−θc is θd=0 when there is no magnetic saturation and is θd≠0 when there is saturation, and it is possible to detect the magnetic saturation by using the technique described above.

Figure 12:
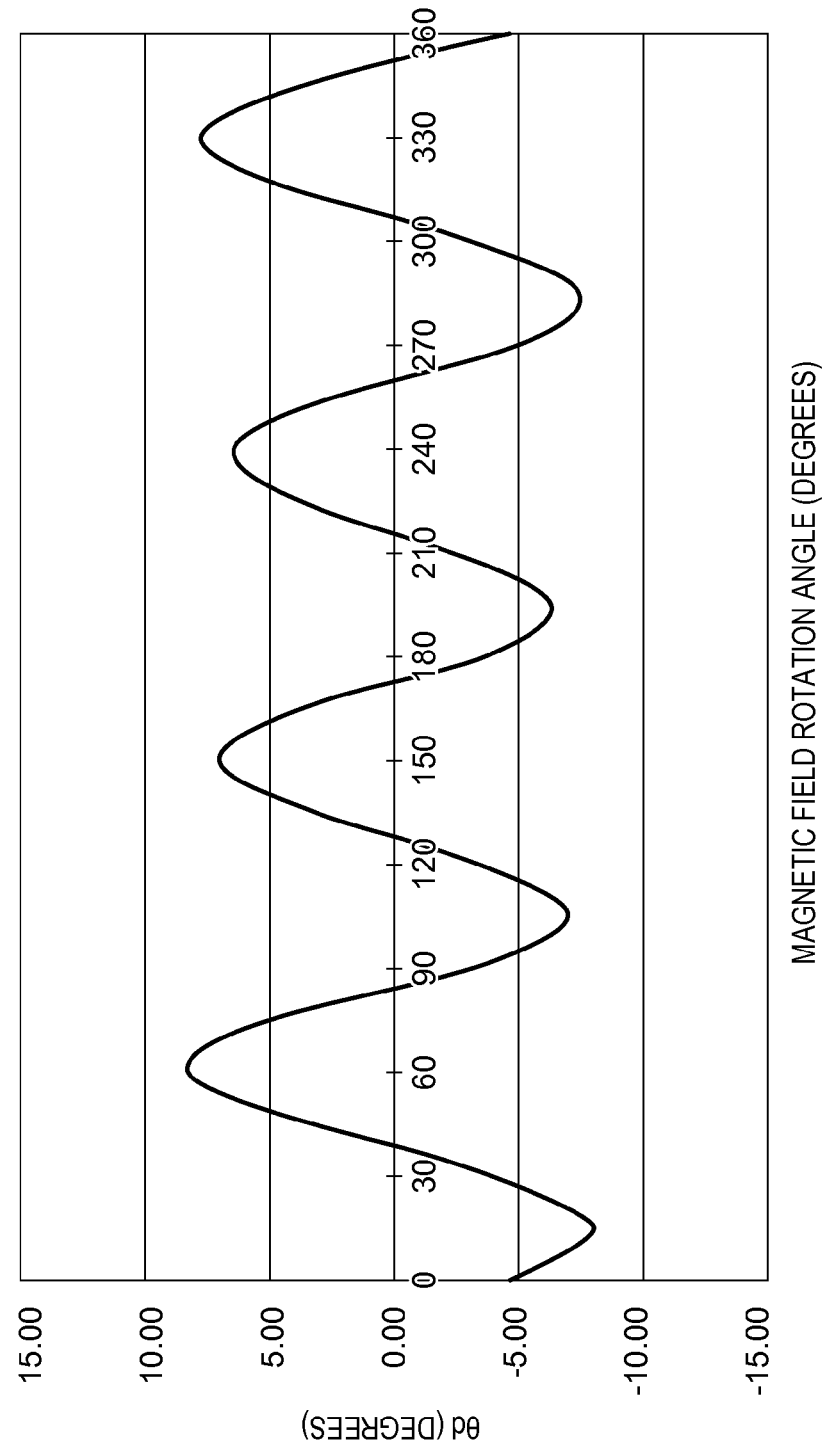
FIG. 12 is a diagram illustrative of simulation results of θd at time when a rotating magnetic field of 100 mT not lower than the magnetic saturation point is applied to the magnetic flux concentrator in a case where θa=30°.

FIG. 12 is a diagram illustrative of simulation results of θd at time when a rotating magnetic field of 100 mT not lower than the magnetic saturation point is applied to the magnetic flux concentrator in a case where θa=30°. It is to be appreciated that θd is not 0 due to the magnetic saturation.

As described above, even in a case where the relation θa=45° is not satisfied, the effects described above are obtained. The case is also included in the present invention. In the case where θa=45°, however, addition (averaging) and subtraction are performed between quadruple waves of angle error differing in phase by 180°, and therefore, Δθave is minimized, and detection sensitivity is improved because the variation of θd is maximized. Therefore, it is preferable for use of the present invention.

Second Embodiment

Figure 13:
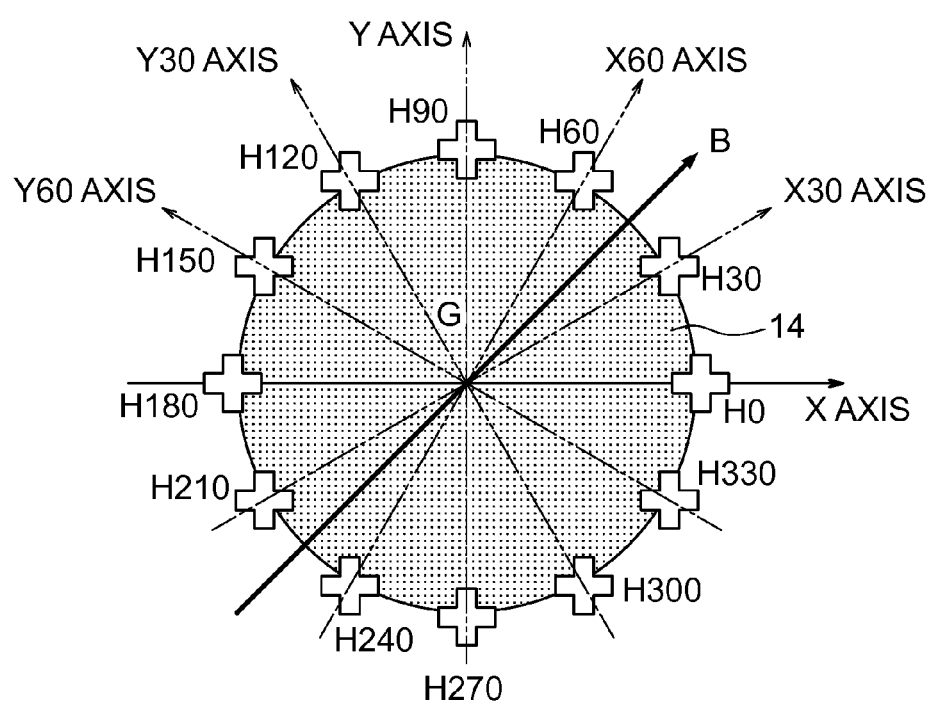
FIG. 13 is a diagram illustrative of arrangement of Hall elements in a rotation angle measurement apparatus according to a second embodiment of the present invention.

FIG. 13 is a diagram illustrative of arrangement of Hall elements in a rotation angle measurement apparatus according to the second embodiment of the present invention.

Twelve Hall elements H0, H30, H60, . . . , H330, in total are arranged under a circumference of a circular magnetic flux concentrator 14, at intervals of 30°. Arrangements of a first Hall element pair 121 (H0 and H180) and a second Hall element pair 122 (H90 and H270) are referred to as arrangement A'. Arrangements of a third Hall element pair 123 (H30 and H210) and a fourth Hall element pair 124 (H120 and H300) are referred to as arrangement B'. Arrangements of a fifth Hall element pair 125 (H60 and H240) and a sixth Hall element pair 126 (H150 and H330) are referred to as arrangement C'.

In other words, plural Hall element pairs are arranged under the circumference of the magnetic flux concentrator at intervals of 30 degrees.

The center point G of the circular magnetic flux concentrator is also a middle point of the first Hall element pair 121 (H0 and H180), the third Hall element pair 123 (H30 and H210), the fifth Hall element pair 125 (H60 and H240), the second Hall element pair 122 (H90 and H270), the fourth Hall element pair 124 (H120 and H300), and the sixth Hall element pair 126 (H150 and H330).

An X axis is formed on a straight line directed from H180 toward H0 in the arrangement A'. A Y axis is formed on a straight line directed from H270 toward H90 in the arrangement A'. In the same way, an X30 axis is formed on a straight line directed from H210 toward H30 in the arrangement B'. A Y30 axis is formed on a straight line directed from H300 toward H120 in the arrangement B'. An X60 axis is formed on a straight line directed from H240 toward H60 in the arrangement C'. A Y60 axis is formed on a straight line directed from H330 toward H150 in the arrangement C'. In other words, coordinate systems formed by the Hall elements in the arrangement A', the arrangement B', and the arrangement C' are referred to as XY coordinate system, XY30 coordinate system, and XY60 coordinate system, respectively. The XY30 coordinate system and the XY60 coordinate system are obtained by rotating the XY coordinate system around the center point G by 30° and 60°, respectively.

In other words, plural Hall element pairs are arranged at positions of coordinate axes in coordinate systems of integer times of 90°/N. In this case, N=3 and the plural Hall element pairs are arranged at positions of coordinate axes in coordinate systems of 0 time, 1 time, and twice of 90°/N. That is to say, when a polar coordinate is defined on the magnetic flux concentrator, the plural Hall element pairs are arranged at positions of coordinate axes of an integral multiple of 90°/N (where N is an integer of 2 or more), with the origin of the polar coordinate being as a reference.

Angles calculated in the respective coordinate systems are denoted by θ, θ30 and θ60. Angle errors generated by the magnetic saturation are denoted by Δθ, Δθ30 and Δθ60, respectively. θ, θ30 and θ60 at time when there is no angle error in a calculated angle are represented by θideal, θ30ideal and θ60ideal, respectively.

Figure 14:
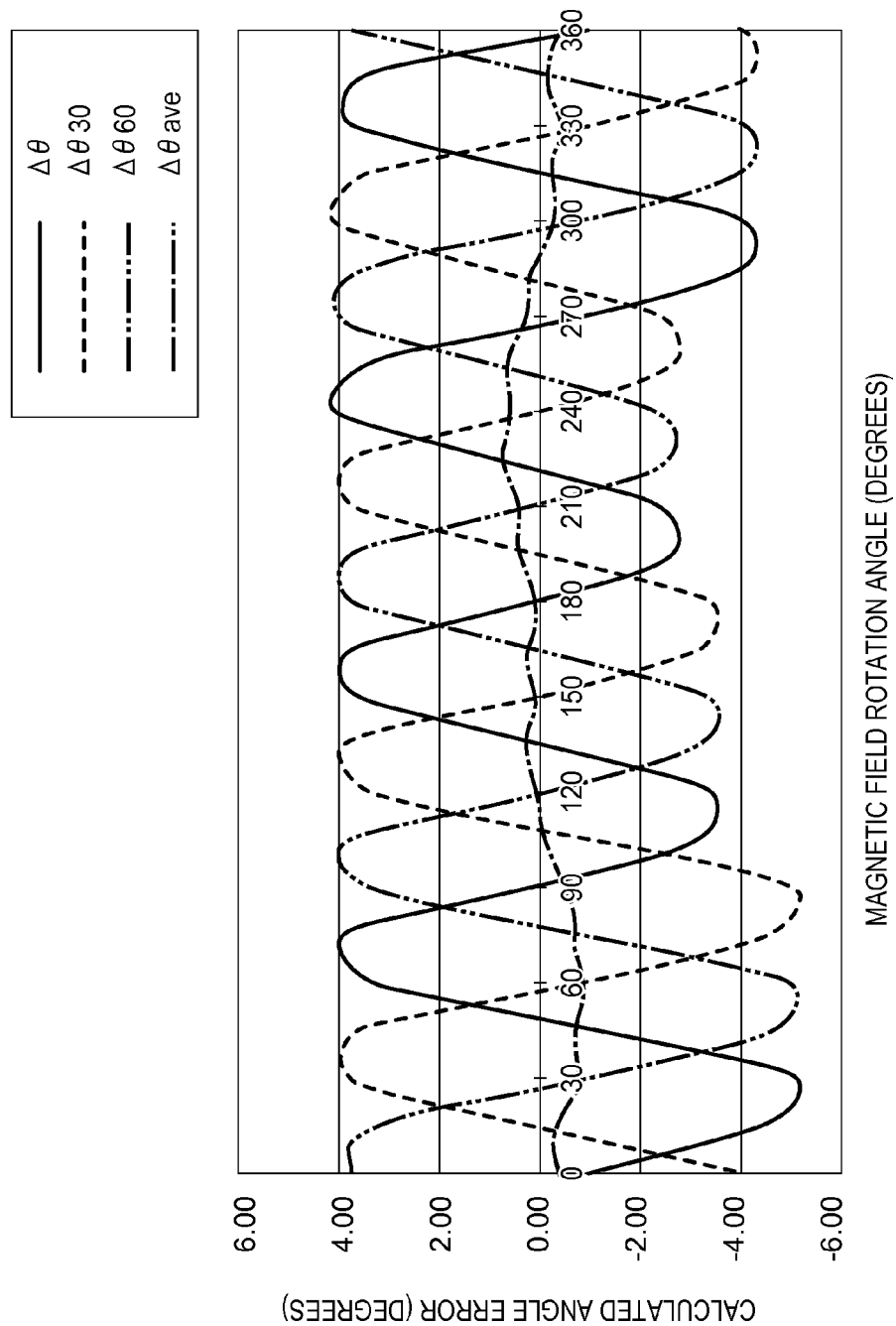
FIG. 14 is a diagram illustrative of simulation results of angle errors Δθ, Δθ30 and Δθ60 generated by the magnetic saturation when a rotating magnetic field of 100 mT not lower than the magnetic saturation point 70 mT is applied to a magnetic flux concentrator in the rotation angle measurement apparatus illustrated in FIG. 13.

FIG. 14 is a diagram illustrative of simulation results of the angle errors Δθ, Δθ30 and Δθ60 generated by the magnetic saturation when the rotating magnetic field of 100 mT not lower than the magnetic saturation point 70 mT is applied to the magnetic flux concentrator in the rotation angle measurement apparatus illustrated in FIG. 13.

In FIG. 14, a solid line indicates Δθ, a dashed line indicates Δθ30, and a double dot dash line indicates Δθ60. It is to be appreciated that Δθ30 forms an error in a waveform differing in phase by 120° from a waveform representing the error Δθ, and Δθ60 forms an error in a waveform differing in phase by 240° from the waveform representing the error Δθ. This is because Δθ measured in the XY coordinate system is a quadruple wave, and consequently Δθ30 measured in the XY30 coordinate system obtained by rotating the XY coordinate system by 30° differs in phase by 30°×4, and Δθ60 measured in the XY60 coordinate system obtained by rotating the XY coordinate system by 60° differs in phase by 60°×4. Therefore, a relation

Δθ+Δθ30+Δθ60≈0 is obtained.

θ=θideal+Δθ

θ30=θ30ideal+Δθ30=θideal−30°+Δθ30

θ60=θ60ideal+Δθ60=θideal−60°+Δθ60

Therefore, an average value θave of θ, θ30+30° (=θc), and θ60+60° (=θc') becomes $$\theta\text{ave} = (\theta + \theta c + \theta c')/3$$
$$= \theta\text{ideal} + (\Delta\theta + \Delta\theta 30 + \Delta\theta 60)/3$$
$$\approx \theta\text{ideal}$$

Even if an angle error is generated by the magnetic saturation, it is possible to obtain an angle in the XY coordinate system with high accuracy. In other words, a highly accurate angle measurement of the magnetic field is achieved by calculating an angle in the XY coordinate system, calculating an angle in the XY30 coordinate system, and calculating an angle in the XY60 coordinate system. A dot dash line in FIG. 14 indicates a residual error Δθave of θave. It is to be appreciated that the residual error Δθave is obviously reduced as compared with Δθ, Δθ30 and Δθ60.

Next, the detection of the magnetic saturation which is another advantageous effect of the present embodiment will now be described.

In the same way as the first embodiment, in a case where the magnetic saturation does not occur, Δθ−Δθ30=0 and Δθ30−Δθ60=0

In a case where the magnetic saturation occurs,

Δθ−Δθ30≠0 and Δθ30−Δθ60≠0 except at angles where the angle errors become equal.

A suitable threshold θd_lim is predetermined. Letting θd=θ−θc and θd'=θc−θc', it becomes possible to detect the magnetic saturation in the magnetic flux concentrator 14 by using relation expressions.

|θd|<θd_lim

|θd'|<θd_lim

Figure 15:
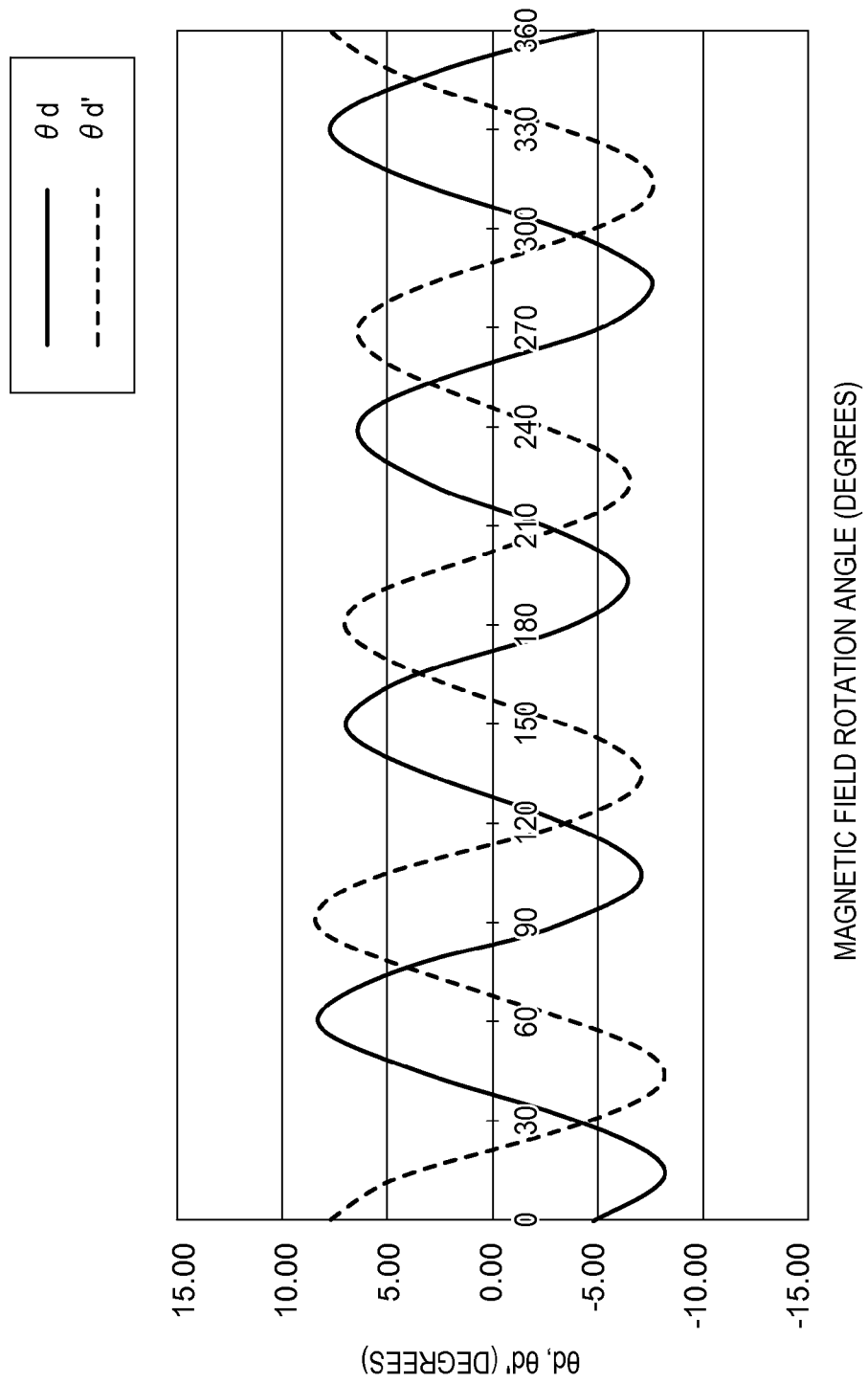
FIG. 15 is a diagram illustrative of simulation results of θd and θd' at time when a rotating magnetic field of 100 mT not lower than the magnetic saturation point 70 mT is applied to the magnetic flux concentrator in the rotation angle measurement apparatus illustrated in FIG. 13.

FIG. 15 is a diagram illustrative of simulation results of θd and θd' at time when a rotating magnetic field of 100 mT not lower than the magnetic saturation point 70 mT is applied to the magnetic flux concentrator in the rotation angle measurement apparatus illustrated in FIG. 13. In FIG. 15, a solid line indicates θd and a dashed line indicates θd'. It is to be appreciated that either θd or θd' is not 0 at all angles of the rotating magnetic field. It is possible to ensure detection of the magnetic saturation as compared with the case of two coordinate systems by using three coordinate systems in this way.

Figure 16:
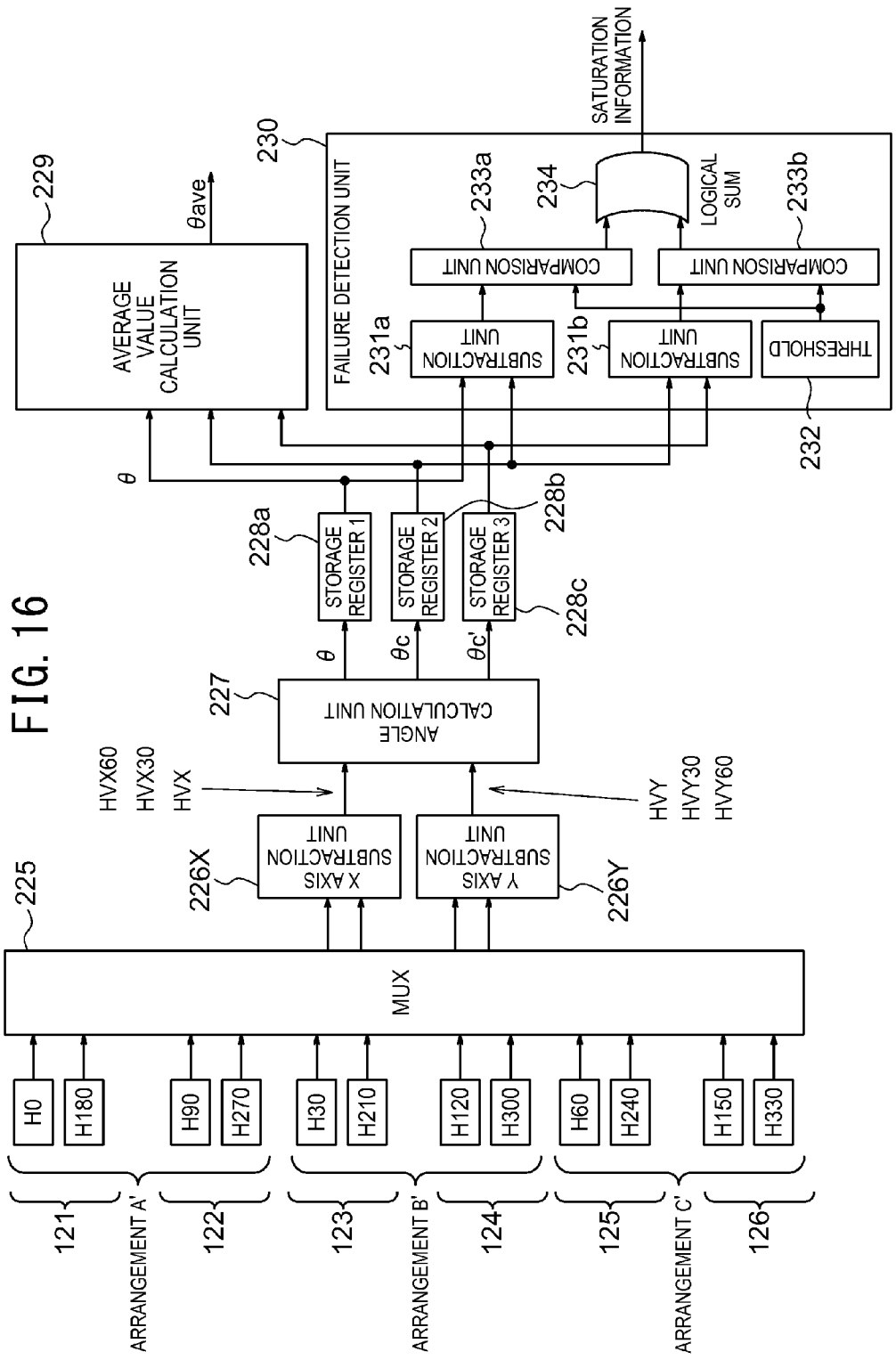
FIG. 16 is a configuration diagram illustrative of a signal processing circuit in the rotation angle measurement apparatus according to the second embodiment of the present invention.

FIG. 16 is a configuration diagram illustrative of a signal processing circuit in the rotation angle measurement apparatus according to the second embodiment of the present invention. The rotation angle measurement apparatus illustrated in FIG. 16 includes: the Hall elements 121 to 126 in groups of the arrangement A', the arrangement B' and the arrangement C'; a MUX 225; an X axis subtraction unit 226X; a Y axis subtraction unit 226Y; an angle calculation unit 227; a first storage register 228*a*; a second storage register 228*b*; a third storage register 228*c*; an average value calculation unit 229; and a failure detection unit 230. The failure detection unit 230 includes: a first subtraction unit 231*a*; a first threshold comparison unit 233*a*; a second subtraction unit 231*b*; a second threshold comparison unit 233*b*; a threshold memory 232; and a logical sum unit 234.

In other words, the rotation angle measurement apparatus according to the second embodiment of the present invention is a rotation angle measurement apparatus which includes the plural Hall elements H0 to H330 provided on a substrate, and a magnetic flux concentrator 14 provided on the magnetosensitive planes of the plural Hall elements H0 to H330, and which measures a rotation angle of a rotating magnet arranged in proximity to the magnetic flux concentrator 14 to cover the magnetic flux concentrator 14 in a planer view.

The rotation angle measurement apparatus according to the second embodiment of the present invention includes plural Hall element pairs constituted by the plural Hall elements H0 to H330, specifically includes: the first Hall element pair 121 (H0 and H180) for detecting a magnetic component in a first direction; the second Hall element pair 122 (H90 and H270) for detecting a magnetic component in a second direction different from the first direction; the third Hall element pair 123 (H30 and H210) for detecting a magnetic component in a third direction different from the first direction and the second direction; the fourth Hall element pair 124 (H120 and H300) for detecting a magnetic component in a fourth direction different from the first to third directions; the fifth Hall element pair 125 (H60 and H240) for detecting a magnetic component in a fifth direction different from the first to fourth directions; and the sixth Hall element pair 126 (H150 and H330) for detecting a magnetic component in a sixth direction different from the first to fifth directions.

The angle calculation unit 227 calculates a first rotation angle θ of the rotating magnet based upon the strengths of the output signals from the first Hall element pair 121 and the second Hall element pair 122, calculates a second rotation angle θc of the rotating magnet based upon the strengths of the output signals from the third Hall element pair 123 and the fourth Hall element pair 124, and calculates a third rotation angle θc' of the rotating magnet based upon the strengths of the output signals from the fifth Hall element pair 125 and the sixth Hall element pair 126. In other words, the angle calculation unit 227 calculates plural pieces of rotation angle information of the rotating magnet based upon the strengths of the output signals from the plural pairs of the plural Hall element pairs (the first Hall element pair 121 and the second Hall element pair 122, the third Hall element pair 123 and the fourth Hall element pair 124, and the fifth Hall element pair 125 and the sixth Hall element pair 126). In other words, the above-described plural pairs denote one set including the first Hall element pair 121 and the second Hall element pair 122, one set of the third Hall element pair 123 and the fourth Hall element pair 124, and one set of the fifth Hall element pair 125 and the sixth Hall element pair 126, and also denote that plural sets, each of which is constituted by two Hall element pairs from the plural Hall element pairs, are provided for the plural pieces of rotation angle information (i.e., three pieces of rotation angle information). Herein, the strength of the output signal means the voltage of the output signal, that is, the Hall electromotive force signal that is output from the Hall element according to the input magnetic field.

Furthermore, the failure detection unit 230 includes the first subtraction unit (referred to as a first difference calculation unit) 231*a* for calculating a difference between the first rotation angle θ and the second rotation angle θc, and the second subtraction unit (referred to as a second difference calculation unit) 231*b* for calculating a difference between the second rotation angle θc and the third rotation angle θc'.

Furthermore, the failure detection unit 230 includes: the first threshold comparison unit 233*a* for detecting a failure in the rotation angle measurement apparatus based upon an output from the first subtraction unit 231*a* and a reference signal that is output from the threshold memory (referred to as a reference signal output unit) 232; and the second threshold comparison unit 233b for detecting a failure in the rotation angle measurement apparatus based upon an output from the second subtraction unit 231b and the reference signal that is output from the threshold memory 232.

The first threshold comparison unit 233a and the second threshold comparison unit 233b detect the magnetic saturation in the magnetic flux concentrator 14. Furthermore, the rotation angle measurement apparatus includes the average value calculation unit 229 for calculating the average value θave from the first rotation angle θ, the second rotation angle θc and the third rotation angle θc'.

In FIG. 16, the outputs from the first Hall element pair 121 (H0 and H180) in the arrangement A', the outputs from the second Hall element pair 122 (H90 and H270) in the arrangement A', the outputs from the third Hall element pair 123 (H30 and H210) in the arrangement B', the outputs from the fourth Hall element pair 124 (H120 and H300) in the arrangement B', the outputs from the fifth Hall element pair 125 (H60 and H240) in the arrangement C', and the outputs from the sixth Hall element pair 126 (H150 and H330) in the arrangement C' are input to the MUX 225. The MUX 225 outputs the outputs from the first Hall element pair 121 (H0 and H180) in the arrangement A' to the X axis subtraction unit 226X, and outputs the outputs from the second Hall element pair 122 (H90 and H270) in the arrangement A' to the Y axis subtraction unit 226Y, at time φ1. At time φ2, the MUX 225 outputs the outputs from the third Hall element pair 123 (H30 and H210) in the arrangement B' to the X axis subtraction unit 226X, and outputs the outputs from the fourth Hall element pair 124 (H120 and H300) in the arrangement B' to the Y axis subtraction unit 226Y. At time φ3, the MUX 225 outputs the outputs from the fifth Hall element pair 125 (H60 and H240) in the arrangement C' to the X axis subtraction unit 226X, and outputs the outputs from the sixth Hall element pair 126 (H150 and H330) in the arrangement C' to the Y axis subtraction unit 226Y.

Outputs from the X axis subtraction unit 226X and the Y axis subtraction unit 226Y are input to the angle calculation unit 227. At the time φ1, the angle calculation unit 227 calculates the angle θ in the XY coordinate system. At the time φ2, the angle calculation unit 227 calculates the angle θc by correcting the angle θ30 in the XY30 coordinate system. At the time φ3, the angle calculation unit 227 calculates the angle θc' by correcting the angle θ60 in the XY60 coordinate system. The angle calculation unit 227 outputs the angles θ, θc and θc' to the first storage register 228a, the second storage register 228b, and the third storage register 228c, respectively. The first storage register 228a outputs the angle θ to the average value calculation unit 229 and the failure detection unit 230, the second storage register 228b outputs the angle θc to the average value calculation unit 229 and the failure detection unit 230, and the third storage register 228c output the angle θc' to the average value calculation unit 229 and the failure detection unit 230. The average value calculation unit 229 calculates θave from θ, θc and θc'. In θave, the angle error caused by the magnetic saturation is reduced.

On the other hand, the angles θ and θc input to the failure detection unit 230 are input to the first subtraction unit 231a. The angles θc and θc' input to the saturation detection unit 230 are input to the second subtraction unit 231b. The first subtraction unit 231a output θd to the first threshold comparison unit 233a. The second subtraction unit 231b outputs θd' to the second threshold comparison unit 233b. The first threshold comparison unit 233a compares θd_lim stored in the threshold memory (reference signal output unit) 232 with the outputs from the first subtraction units 231a. The second threshold comparison unit 233b compares θd_lim stored in the threshold memory (i.e., reference signal output unit) 232 with the outputs from the second subtraction units 231b. If the magnetic saturation is detected, the first comparison unit 233a and the second comparison unit 233b output "1" to the logical sum unit 234. Unless the magnetic saturation is detected, the first comparison unit 233a and the second comparison unit 233b output "0" to the logical sum unit 234. The logical sum unit 234 outputs a logical sum of the outputs from the first and second threshold comparison units 233a and 233b as saturation information. Therefore, if either θd or θd' is greater than θd_lim, the saturation is detectable.

In the above-described example, θd_lim is used as a common reference signal for θd and θd'. However, it is also possible to use θd_lim as a first reference signal for θd and prepare θd'_lim as a second reference signal for θd'. In other words, the first reference signal and the second reference signal are made the same in the above described example.

As appreciated from the foregoing description of the embodiments, the angle error generated by the magnetic saturation is periodical and represented by the quadruple wave, in the XY coordinate system formed by a Hall element group under the magnetic flux concentrator. A quadruple wave of angle error having a different phase from the quadruple wave in the XY coordinate system is generated in a different XY coordinate system formed by a different Hall element group. A phase difference (angle difference) between the quadruple waves is utilized by performing addition (averaging) or subtraction. As a result, it becomes possible to reduce the angle error generated by the magnetic saturation or detect the magnetic saturation.

According to the present invention, it suffices to prepare coordinate systems for generating a waveform of the angle error different in phase from the waveform of the angle error generated by the magnetic saturation in the XY coordinate system functioning as the reference. The number of coordinate systems is not limited to two or three as described in the first and second embodiments.

If the number of coordinate systems formed under the magnetic flux concentrator is N (where N is an integer of at least two) and a kth (where $1<=k<=N$) coordinate system is arranged to have a rotation angle from the XY coordinate system of $90°/N \times k$, it is possible to perform effectively the reduction of the angle error caused by the magnetic saturation according to the present invention. The first embodiment corresponds to a case where N=2, and the second embodiment corresponds to a case where N=3.

Furthermore, the embodiments of the present invention have been described supposing that the number of Hall elements included in each coordinate system is four and the number of Hall elements included as components of each coordinate axis is two, for brevity. However, the numbers of Hall elements are not limited to these numbers as long as each coordinate axis can be represented equally. For example, in the first embodiment, each axis in the XY coordinate system and the XY45 coordinate system includes two Hall elements. Alternatively, each axis may include four Hall elements.

Figure 17:
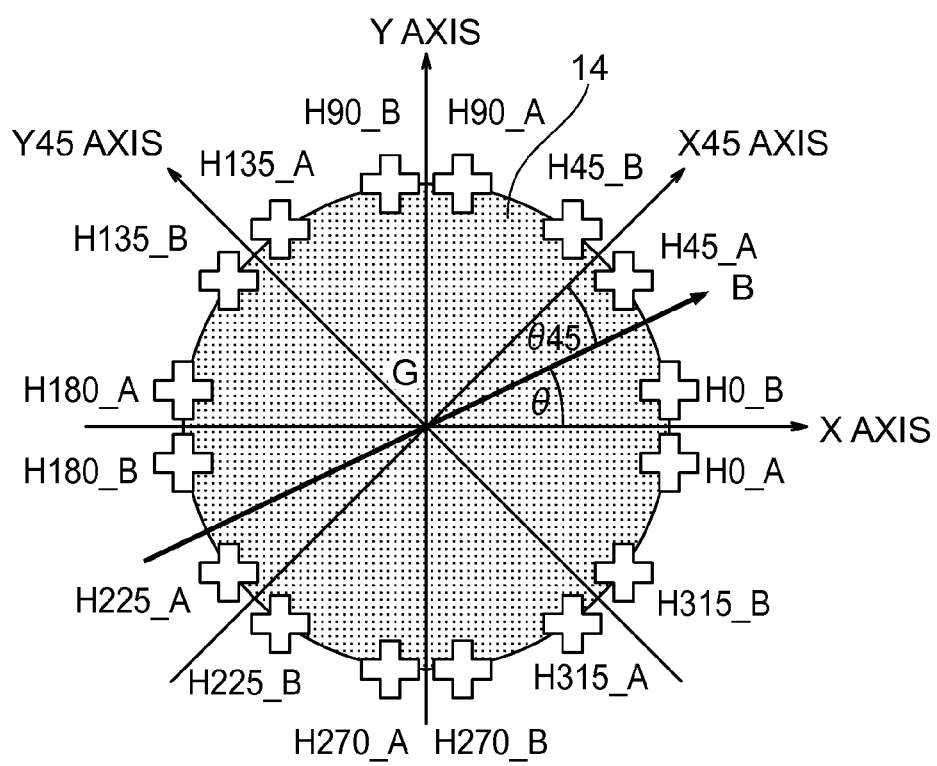
FIG. 17 is a diagram illustrative of a modification of according to the first embodiment illustrated in FIG. 7.

FIG. 17 is a diagram illustrative of a modification of the first embodiment illustrated in FIG. 7. FIG. 17 is a diagram illustrative of arrangement of Hall elements in a case where sixteen Hall elements in total are arranged under a circumference of a magnetic flux concentrator. In other words, when a polar coordinate is defined on the magnetic flux concentrator, two Hall element pairs are arranged to interpose coordinate axes of an integral multiple of 90°/N, with the origin of the polar coordinate being as a reference. Here, N=2, and two Hall element pairs of the plural Hall element pairs are arranged to interpose the coordinate axes in coordinate systems of zero time and one time of 90°/N. In FIG. 17, Hall elements are arranged under the circumference of the magnetic flux concentrator counterclockwise in order of H0_A, H0_B, H45_A, H45_B, H90_A, H90_B, H135_A, H135_B, H180_A, H180_B, H225_A, H225_B, H270_A, H270_B, H315_A, and H315_B.

A numeral in each Hall element name represents an angle from the X axis. In a suffix, "A" represents a deviation−δ (degrees) from the angle and "B" represents a deviation+δ (degrees) from the angle (where 0°<δ<22.5°. In other words, H45_A has an angle of 45−δ degrees from the X axis, whereas H45_B has an angle of 45+δ degrees from the X axis. An X axis is formed on a straight line extending from a middle point between H180_A and H180_B to a middle point between H0_A and H0_B. A Y axis is formed on a straight line extending from a middle point between H270_A and H270_B to a middle point between H90_A and H90_B. An X45 axis is formed on a straight line extending from a middle point between H225_A and H225_B to a middle point between H45_A and H45_B. A Y45 axis is formed on a straight line extending from a middle point between H315_A and H315_B to a middle point between H135_A and H135_B. As a result, it is possible to form an XY coordinate system and an XY45 coordinate system in the same way as the first embodiment.

That is to say, the hall element pair 21A (H0_A, H180_A) of 1A and the hall element pair 21B (H0_B, H180_B) of 1B are arranged to interpose the coordinate axis of 0 degrees. The hall element pair 23A (H45_A, H225_A) of 3A and the hall element pair 23B (H45_B, H225_B) of 3B are arranged to interpose the coordinate axis of 45 degrees. The hall element pair 22A (H90_A, H270_A) of 2A and the hall element pair 22B (H90_B, H270_B) of 2B are arranged to interpose the coordinate axis of 90 degrees. The hall element pair 24A (H135_A, H315_A) of 4A and the hall element pair 25B (H135_B, H315_B) of 4B are placed across the coordinate axis of 90 degrees.

In other words, a difference between an output sum from H0_A and H0_B and an output sum from H180_A and H180_B becomes an X component (HVX) of a rotating magnetic field. A difference between an output sum from H90_A and H90_B and an output sum from H270_A and H270_B becomes a Y component (HVY). A difference between an output sum from H45_A and H45_B and an output sum from H225_A and H225_B becomes an X45 component (HVX45). A difference between an output sum from H135_A and H135_B and an output sum from H315_A and H315_B becomes a Y45 component (HVY45). Such a technique for computing each axis component by using at least two Hall elements is described in aforementioned PTL 6.

In other words, the plural sets of the plural Hall element pairs include one set constituted by 1A, 1B, 2A, and 2B and one set constituted by 3A, 3B, 4A, and 4B. This means that plural sets, each of which is constituted by four Hall element pairs from the plural Hall element pairs, are provided for the plural pieces of rotation angle information.

Accordingly, it is possible to constitute components of each of the coordinate axes X, Y, X45 and Y45 as the first embodiment equally, by using four Hall elements, and the present invention is achievable.

In addition, in the same manner, the components of each coordinate axis can be configured by four Hall elements equally in the second embodiment, so as to achieve the present invention.

In each of the above-described embodiments, the descriptions have been given that the magnetic saturation is detected by the difference θd between the first rotation angle θ calculated from the Hall element in the arrangement A and the second rotation angle θc calculated from the Hall element in the arrangement B. By adding an amplitude calculation unit to the configurations of the above-described embodiments, the detection of the magnetic saturation with higher accuracy is enabled, as will be described below.

Third Embodiment

Figure 18:
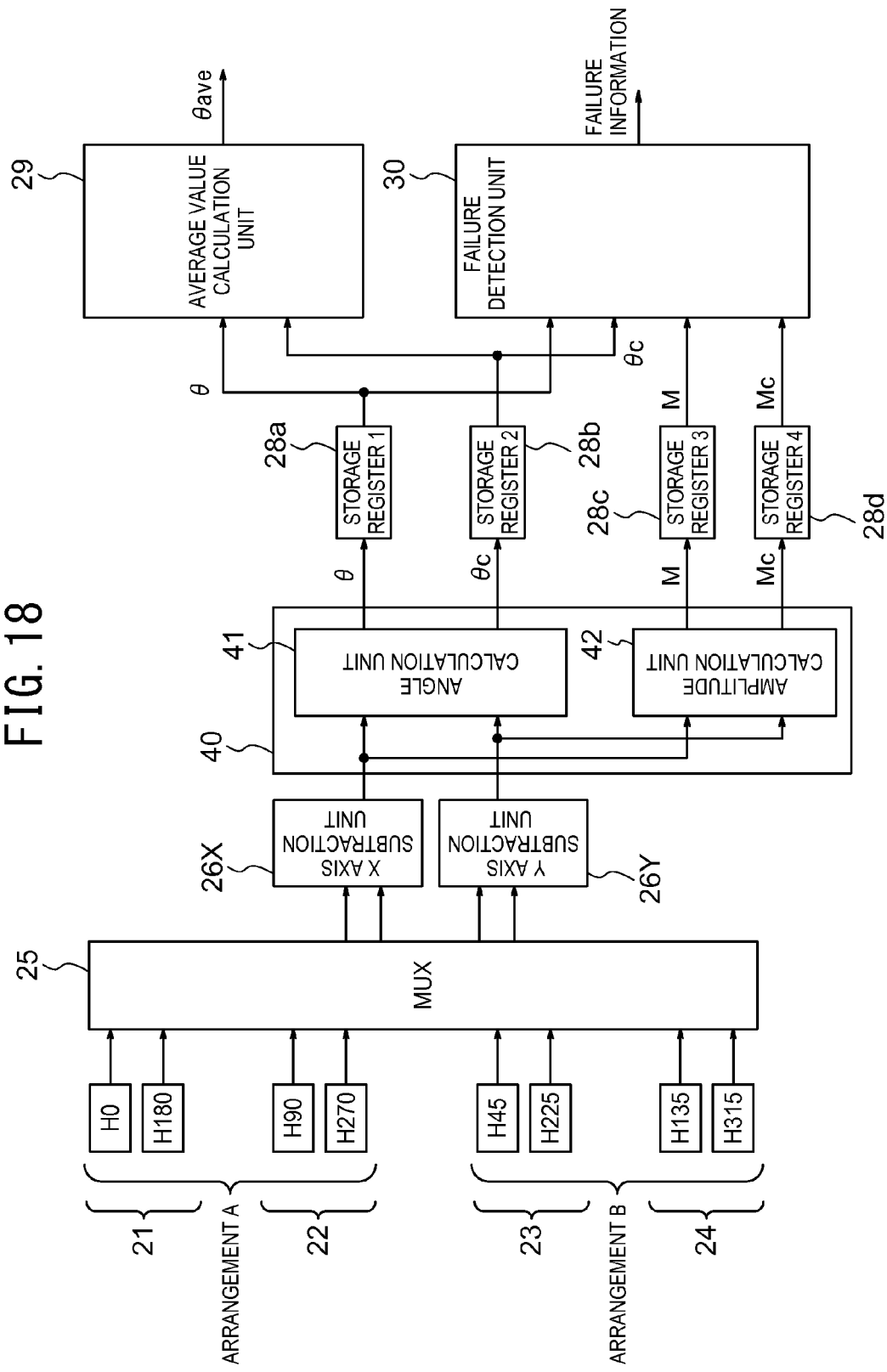
FIG. 18 is a configuration diagram illustrative of a signal processing circuit of the rotation angle measurement apparatus according to a third embodiment of the present invention.

FIG. 18 is a configuration diagram illustrative of a signal processing circuit of the rotation angle measurement apparatus according to a third embodiment of the present invention. It is to be noted that the arrangements of the magnetic flux concentrator and the Hall elements are same as those in FIG. 7 according to the first embodiment of the present invention.

The rotation angle measurement apparatus of FIG. 18 includes: the first Hall element pair 21 (H0, H180) in the arrangement A; the second Hall element pair 22 (H90, H270) in the arrangement A; the third Hall element pair 23 (H45, H225) in the arrangement B; the fourth Hall element pair 24 (H135, H315) in the arrangement B; the MUX 25; the X axis subtraction unit 26X; the Y axis subtraction unit 26Y; an angle amplitude calculation unit 40 (including an angle calculation unit 41 and an amplitude calculation unit 42); the first storage register 28a; the second storage register 28b; a third storage register 28c; a fourth storage register 28d; the average value calculation unit 29; and a failure detection unit 30.

That is to say, the rotation angle measurement apparatus according to the third embodiment of the present invention includes the plural Hall elements H0 to H315 arranged on the substrate, and the magnetic flux concentrator on the magnetosensitive planes of the plural Hall elements H0 to H315, so that the rotation angle measurement apparatus measures the rotation angle of the rotating magnet arranged in proximity to the magnetic flux concentrator to cover the magnetic flux concentrator in a planer view.

The rotation angle measurement apparatus includes: the first Hall element pair 21 (H0 and H180) for detecting the magnetic component in the first direction; the second Hall element pair 22 (H90 and H270) for detecting the magnetic component in the second direction different from the first direction; the third Hall element pair 23 (H45 and H225) for detecting the magnetic component in the third direction different from the first direction and the second direction; and the fourth Hall element pair 24 (H135 and H315) for detecting the magnetic component in the fourth direction different from the first to third directions.

The angle amplitude calculation unit 40 includes the angle calculation unit 41 and the amplitude calculation unit 42.

The angle calculation unit 41 calculates the first rotation angle θ of the rotating magnet based upon the strengths of the output signals from the first Hall element pair 21 and the second Hall element pair 22, and calculates the second rotation angle θc of the rotating magnet based upon the strengths of the output signals from the third Hall element pair 23 and the fourth Hall element pair 24. In other words, the angle calculation unit 27 calculates plural pieces of rotation angle information of the rotating magnet, based upon the strengths of the output signals from the plural pairs of the plural Hall element pairs (the first Hall element pair 21 and the second Hall element pair 22, and the third Hall element pair 23 and the fourth Hall element pair 24). That is to say, the above-described plural pairs denote one set constituted by first Hall element pair 21 and the second Hall element pair 22, and one set constituted by the third Hall element pair 23 and the fourth Hall element pair 24, and also denote that plural sets, each of which is constituted by two Hall element pairs from the plural Hall element pairs, are provided for the plural pieces of rotation angle information. Herein, the strength of the output signal means the voltage of the output signal, that is, the Hall electromotive force signal that is output from the Hall element according to the input magnetic field.

The amplitude calculation unit 42 calculates a first amplitude value M representing the magnetic field strength from the rotating magnet based upon the strengths of the output signals from the first Hall element pair 21 and the second Hall element pair 22, and calculates a second amplitude value Mc representing the magnetic field strength from the rotating magnet based upon the strengths of the output signals from the third Hall element pair 23 and the fourth Hall element pair 24. In other words, the amplitude calculation unit 42 calculates plural pieces of the amplitude information based upon the output signals from the plural pairs (i.e., the plural sets), the output signals corresponding to the plural pieces of rotation angle information.

In addition, the failure detection unit 30 detects a failure of the rotation angle measurement apparatus based upon the first and second rotation angles θ and θc and the first and second amplitude values M and Mc, and outputs failure information. Further, the average value calculation unit 29 calculates an average value θave from the first rotation angle θ and the second rotation angle θc.

In the rotation angle measurement apparatus of FIG. 18, the outputs from the first Hall element pair 21 (H0, H180) in the arrangement A, the outputs from the second Hall element pair 22 (H90, H270) in the arrangement A, and the outputs from the third Hall element pair 23 (H45, H225) in the arrangement B, and the outputs from the fourth Hall element pair 24 (H135, H315) in the arrangement B are input to the MUX 25.

The MUX 25 outputs the outputs from the first Hall element pair 21 (H0 and H180) in the arrangement A to the X axis subtraction unit 26X, and outputs the outputs from the second Hall element pair 22 (H90 and H270) in the arrangement A to the Y axis subtraction unit 26Y, at time φ1. The X axis subtraction unit 26X outputs the output signal HVX to the angle calculation unit 41 and the amplitude calculation unit 42 of the angle amplitude calculation unit 40. The Y axis subtraction unit 26Y outputs the output signal HVY to the angle calculation unit 41 and the amplitude calculation unit 42 of the angle amplitude calculation unit 40.

The angle calculation unit 41 calculates the angle θ of the XY coordinate system at time φ1, and output it to the first storage register 28a.

The amplitude calculation unit 42 calculates the first amplitude value M representing the magnetic field strength in accordance with, for example, the following expression, at time φ1, M=sqrt (HVX$^2$+HVY$^2$) and outputs it to the third storage register 28c. It is to be noted that sqrt (X) is a function to calculate a square root of X. Furthermore, if the magnetic saturation does not occur, it is apparent that M=$V_B$ is satisfied, and it is apparent that the signal amplitudes of HVX and HVY, that is, the magnetic strengths from the rotating magnet are indicated.

Then, at time φ2, the MUX 25 outputs the outputs from the third Hall element pair 23 (H45 and H225) in the arrangement B to the X axis subtraction unit 26X and outputs the outputs from the fourth Hall element pair 24 (H135 and H315) in the arrangement B to the Y axis subtraction unit 26Y. The X axis subtraction unit 26X outputs the output signal HVX45 to the angle calculation unit 41 and the amplitude calculation unit 42 of the angle amplitude calculation unit 40. The Y axis subtraction unit 26Y outputs the output signal HVY45 to the angle calculation unit 41 and the amplitude calculation unit 42 of the angle amplitude calculation unit 40.

The angle calculation unit 41 calculates the angle θ45 of the XY45 coordinate system at time φ2, and outputs the angle θc corrected by 45 degrees to the second storage register 28b.

The amplitude calculation unit 42 calculates the second amplitude value Mc representing the magnetic field strength in accordance with, for example, the following expression, at time φ2, Mc=sqrt (HVX45$^2$+HVY45$^2$) and outputs it to the fourth storage register 28d.

Furthermore, as already described above, if the magnetic saturation does not occur, it is apparent that M=$V_B$ is satisfied, and it is apparent that the signal amplitudes of HVX45 and HVY45, that is, the magnetic strengths from the rotating magnet are indicated.

The first storage register 28a outputs θ to the average value calculation unit 29 and the failure detection unit 30 and the second storage register 28b outputs θc to the average value calculation unit 29 and the failure detection unit 30. The third storage register 28c outputs M to the failure detection unit 30 and the fourth storage registers 28d outputs Mc to the failure detection unit 30.

The average value calculation unit 29 calculates θave from θ and θc. In θave, the angle error by the magnetic saturation is reduced. The failure detection unit 30 detects a failure from θ, θc, M and Mc, and outputs failure information.

Figure 19:
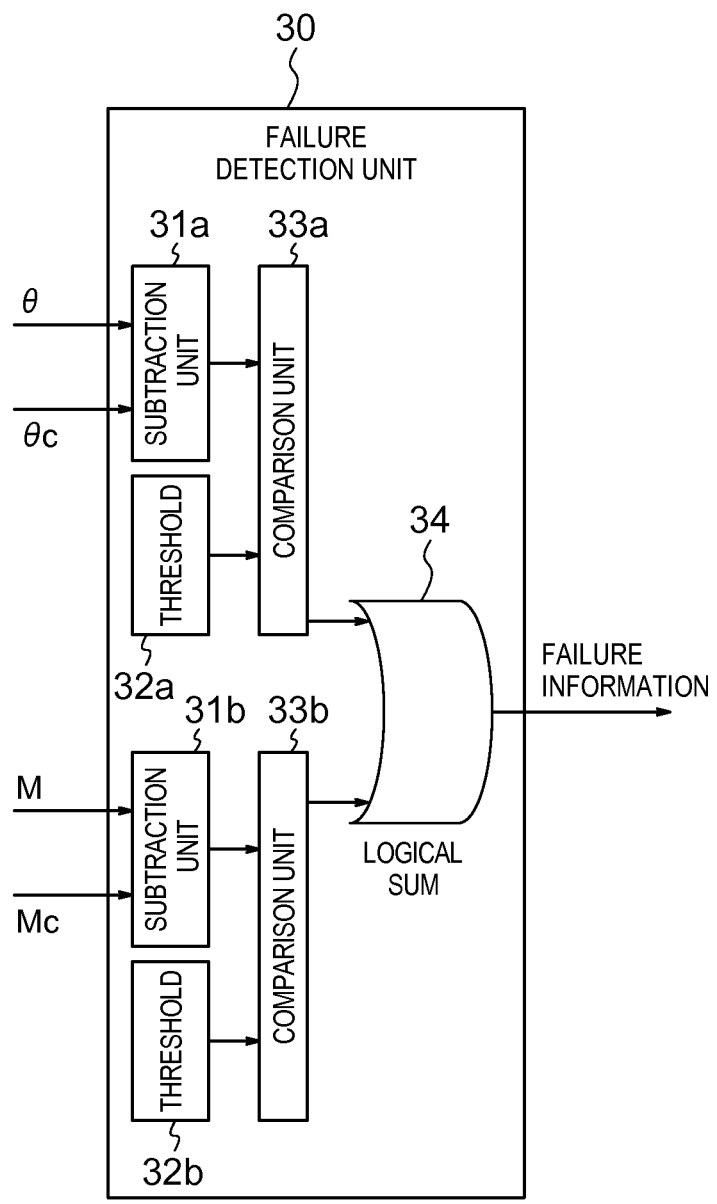
FIG. 19 is a circuit configuration diagram illustrative of a specific example of the failure detection unit of FIG. 18.

FIG. 19 is a circuit configuration diagram illustrative of a specific example of the failure detection unit 30.

In FIG. 19, the failure detection unit 30 includes: a first subtraction unit 31a; a first comparison unit 33a; a first threshold memory (a first reference signal output unit) 32a; a second subtraction unit 31b; a second comparison unit 33b; a second threshold memory (a second reference signal output unit) 32b; and a logical sum unit (a failure combination determination unit) 34.

The first subtraction unit 31a calculates θd from the first rotation angle θ and the second rotation angle θc, and outputs θd to the first comparison unit 33a. The first comparison unit 33a detects a failure from θd and θd_lim (i.e., a threshold) stored in the first threshold memory 32a, and outputs a first failure determination signal to the logical sum unit 34, for example, "1" in a case of failure or "0" in a case of normality.

The second subtraction unit 31b calculates a difference value Md represented by Md=M−Mc from a first amplitude value M and a second amplitude value Mc, and then outputs the difference value Md to the second comparison unit 33b. The second comparison unit 33b detects a failure from Md and Md_lim (i.e., a threshold) stored in the second threshold memory 32b, and outputs a second failure determination signal to the logical sum unit 34, for example, "1" in a case of failure or "0" in a case of normality.

The logical sum unit 34 receives the first and second failure determination signals from the first comparison unit 33a and the second comparison unit 33b, respectively, and outputs failure information. That is to say, the logical sum unit 34 outputs "1" in a case where at least one of the first and second failure determination signals indicates a failure, or outputs "0" in a case where both of the first and second failure determination signals indicate normal.

Figure 20:
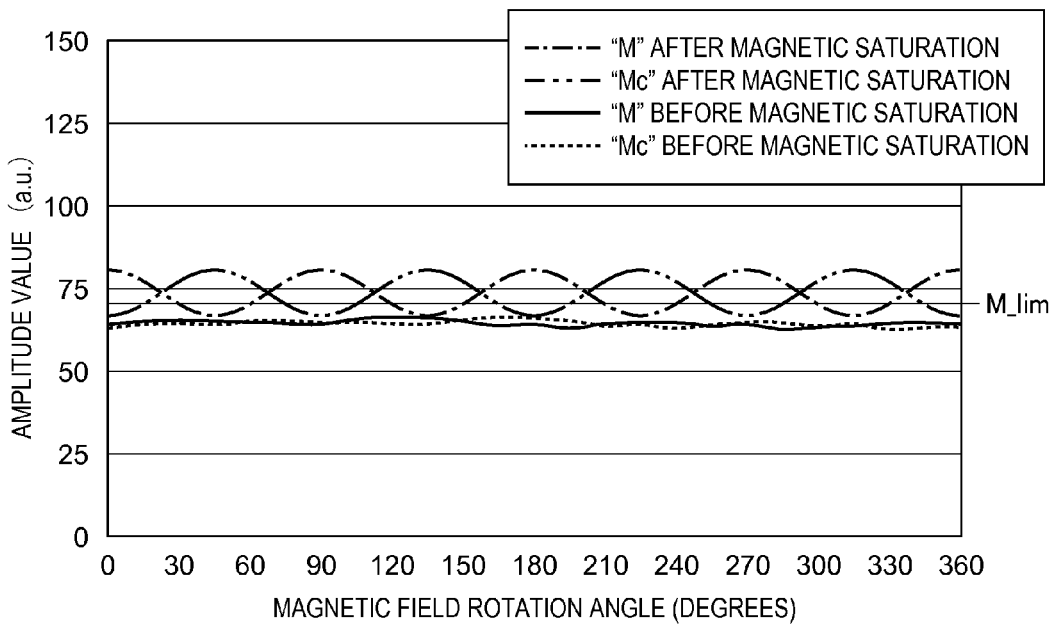
FIG. 20 is a view illustrative of how the amplitude value M (solid line) calculated from the outputs from the Hall elements in the arrangement A and the amplitude value Mc (dotted line) calculated from the outputs from the Hall elements in the arrangement B change with respect to the rotation of the input magnet field before the magnetic saturation, and how the amplitude value M (dashed line) and the amplitude value Mc (double-dashed line) change with respect to the rotation of the input magnet field after the magnetic saturation, in the magnetic flux concentrator of the rotation angle measurement apparatus in FIG. 18.

FIG. 20 is a view illustrative of how the amplitude value M (solid line) calculated from the outputs from the Hall elements in the arrangement A and the amplitude value Mc (dotted line) calculated from the outputs from the Hall elements in the arrangement B change with respect to the rotation of the input magnet field before the magnetic saturation, and how the amplitude value M (dashed line) and the amplitude value Mc (double-dashed line) change with respect to the rotation of the input magnet field after the magnetic saturation, in the magnetic flux concentrator of the rotation angle measurement apparatus in FIG. 18.

No difference can be found between M and Mc before the magnetic saturation, but both of M and Mc after the magnetic saturation oscillate having positive or negative peaks at the angles of K×45 degrees (where K is an integer of 0 to 7), and quadruple waves, the phases of which are different from each other by 180 degrees, are recognized. In addition, the lowest value in the oscillation is recognized to be near M and Mc before the magnetic saturation.

Thus, it is difficult to determine properly whether the magnetic saturation is occurring by observing only one of the amplitude value M and Mc, depending on the rotation angle of the magnetic field. For example, even if the threshold value M_lim in FIG. 20 is assumed to be the magnetic saturation point with respect to the amplitude M, it is difficult to determine the magnetic saturation soon and properly because M is lower than M_lim when the input magnetic field is around 45 degrees.

Figure 21:
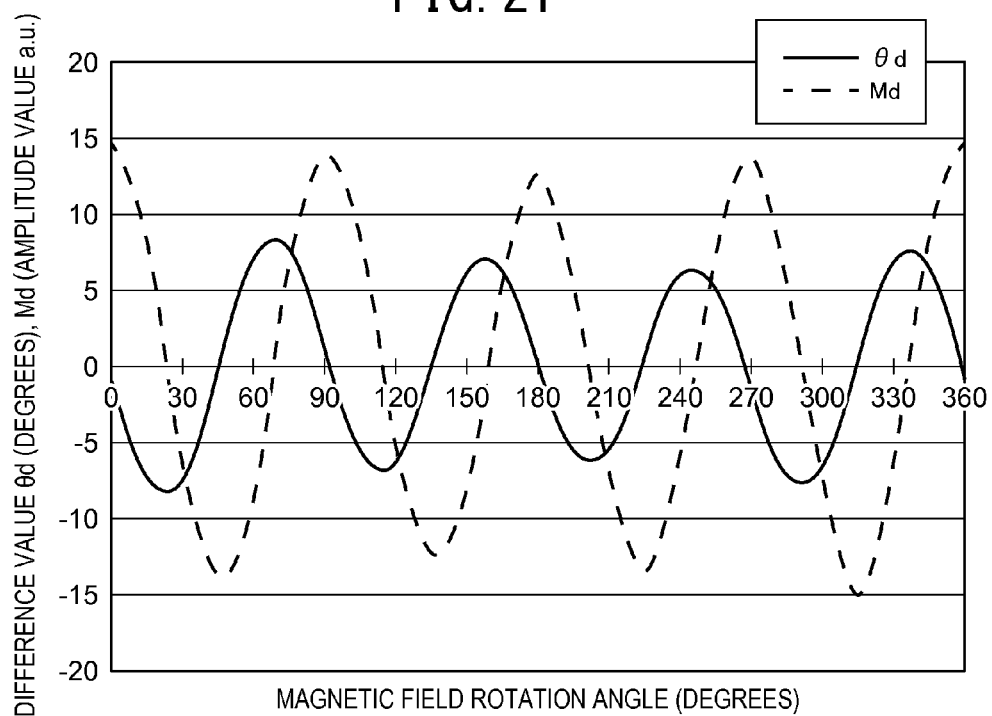
FIG. 21 is a diagram illustrative of simulation results of θd and Md when the rotating magnetic field not lower than the magnetic saturation point is applied to the magnetic flux concentrator of the rotation angle measurement apparatus of FIG. 18.

FIG. 21 is a diagram illustrative of simulation results of θd and Md when the rotating magnetic field not lower than the magnetic saturation point is applied to the magnetic flux concentrator of the rotation angle measurement apparatus of FIG. 18. The abscissa axis represents the rotation angle of the magnetic field, whereas the ordinate axis represents θd and Md. θd is indicated by a solid line, and the Md is indicated by a broken line.

Like the first embodiment as described above, the quadruple waves are formed by the magnetic saturation, and θd is not 0 except the angle of K×45 degrees. The positive peak of θd is 67.5+90×L degrees (where L is an integer of 0 to 3). The negative peak of θd is 22.5+90×L degrees.

Md also forms a quadruple wave same as θd, but is different from θd in that Md is not 0 and forms a phase advanced from θd by 90 degrees at the angles except the angle of 22.5+K×45 degrees. The positive peak of Md is 90×L degrees, and the negative peak is 45+90×L degrees. Therefore, Md is not 0 when θd is 0.

If the magnetic saturation is not occurring, the strength of the magnetic field observed by the Hall elements does not change in the XY coordinate system or in the XY45 coordinate system. In other words, M=Mc is satisfied. Therefore, Md is 0. However, if the magnetic saturation occurs, $$Md=M-Mc\neq 0.$$

is satisfied because the phases of M and Mc are different from each other. Therefore, by determining the suitable threshold Md_lim with respect to Md, it is possible to detect that the magnetic saturation is occurring by use of Md only, according to the relational expression of |Md|<Md_lim (where |Md| is an absolute value of Md), when |Md| is larger than Md_lim.

Additionally, there is a relationship that Md is not 0, when θd is 0. In the first embodiment, therefore, the magnetic saturation cannot be detected when θd is 0. However, Md is not 0 in that case and thus the magnetic saturation can be detected instead of θd.

That is to say, the first comparison unit 33a detects the magnetic saturation (i.e., failure) from θd and θd_lim, and outputs the first failure determination signal to the logical sum unit 34, and the second comparison unit 33b detects the magnetic saturation (i.e., failure) from Md and Md_lim, and outputs the second failure determination signal to the logical sum unit 34, and the logical sum unit 34 calculates a logical sum of the first and second failure determination signals. Therefore, it is made possible to output the failure information at all the rotation angles of the magnetic field. In other words, the failure of the rotation angle measurement apparatus is determined, when the failure detection unit 30 shows at least one of the first failure determination signal indicating whether or not the rotation angle measurement apparatus has a failure based upon the outputs from the angle calculation unit 41 and the second failure determination signal indicating whether or not the rotation angle measurement apparatus has a failure based upon plural pieces of amplitude information.

As described above, according to the present invention, the failure of the rotation angle measurement apparatus can be detected from the first and second rotation angles θ and θc and the first and second amplitude values M and Mc, and the failure information can be output. Since the detection of the failure does not depend on the angle of the input rotating magnetic field, as compared to the first embodiment, it is possible to detect a failure with certainty. Also, by reducing the number of the Hall elements from that of the second embodiment and adding only the amplitude calculation unit realized by a small-sized operation, it is possible to detect a failure with certainty.

Figure 22:
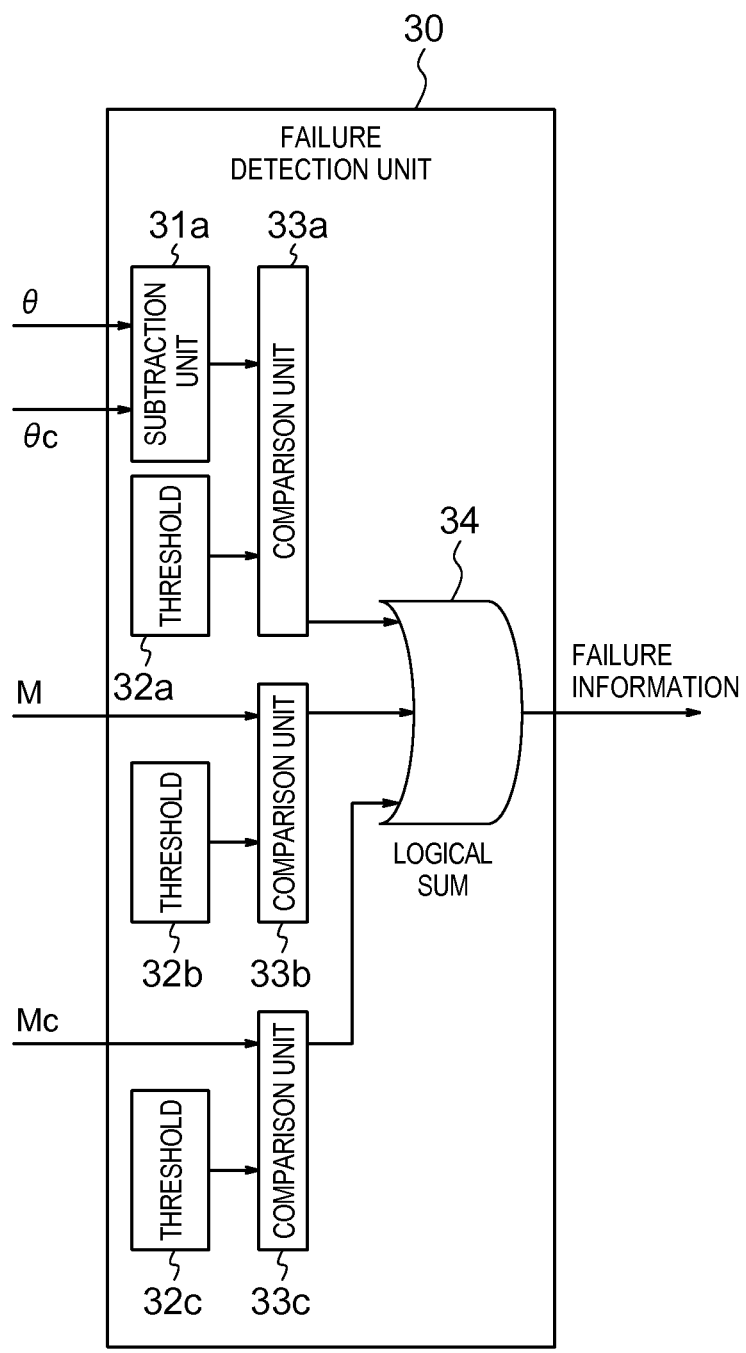
FIG. 22 is a circuit configuration diagram illustrative of another specific example of the failure detection unit in FIG. 18.

FIG. 22 is a circuit configuration diagram illustrative of another specific example of the failure detection unit in FIG. 18.

In FIG. 22, the failure detection unit 30 includes: the first subtraction unit 31a; the first comparison unit 33a; the first threshold memory 32a; a second comparison unit 33b; a second threshold memory 32b; a third comparison unit 33c; a third threshold memory (a third reference signal output unit) 32c; and a logical sum unit (the failure combination determination unit) 34.

The first subtraction unit 31a, the first comparison unit 33a, and the first threshold memory 32a are same as those in FIG. 19.

The second comparison unit 33b detects a failure from the first amplitude value M and M_lim (i.e., a threshold value) stored in the second threshold memory 32b, and outputs to the logical sum unit 34 the second failure determination signal, which is, for example, "1" (i.e., failure) when M is larger than M_lim or "0" (i.e., normality) when M is smaller than M_lim. The third comparison unit 33c detects a failure from the second amplitude value Mc and Mc_lim (i.e., a threshold value) stored in the third threshold memory 32c, and outputs to the logical sum unit 34 the third failure determination signal, which is, for example, "1" (i.e., failure) when Mc is larger than Mc_lim or "0" (i.e., normality) when Mc is smaller than Mc_lim. Herein, M_lim and Mc_lim may be an identical value (it is to be noted that the description will be given of the case where M_lim and Mc_lim are an identical value). That is, like each comparison unit of the failure detection unit 30 in FIG. 19, each comparison unit of the failure detection unit 30 in FIG. 22 also outputs "1" in the case of failure or "0" in the case of normality.

As appreciated from FIG. 20 and FIG. 21, when θd is 0 and the magnetic saturation cannot be detected from the difference between the first rotation angle θ and the second rotation angle θc, either M or Mc certainly exceeds M_lim. For example, when the rotation angle of the magnetic field is 0 degree, θd is 0, but M exceeds M_lim. When the rotation angle of the magnetic field is 45 degrees, θd is 0, but Mc exceeds M_lim (=Mc_lim). Therefore, either one of the second failure determination signal that is output from the second comparison unit 33b or the third failure determination signal that is output from the third comparison unit 33c indicates "1" or "0".

Therefore, it is made possible to output the failure information at all the rotation angles of the magnetic field, by operating the logical sum of the first, second, and third failure determination signals in the logical sum unit 34. That is to say, when the failure detection unit 30 shows that at least one of the first to third failure determination signals indicates a failure, the failure of the rotation angle measurement apparatus is determined.

In other words, according to the present invention, it is made possible to output the failure information with accuracy at all the rotation angles of the magnetic field, although it is difficult by merely observing θd, M or Mc.

Figure 23:
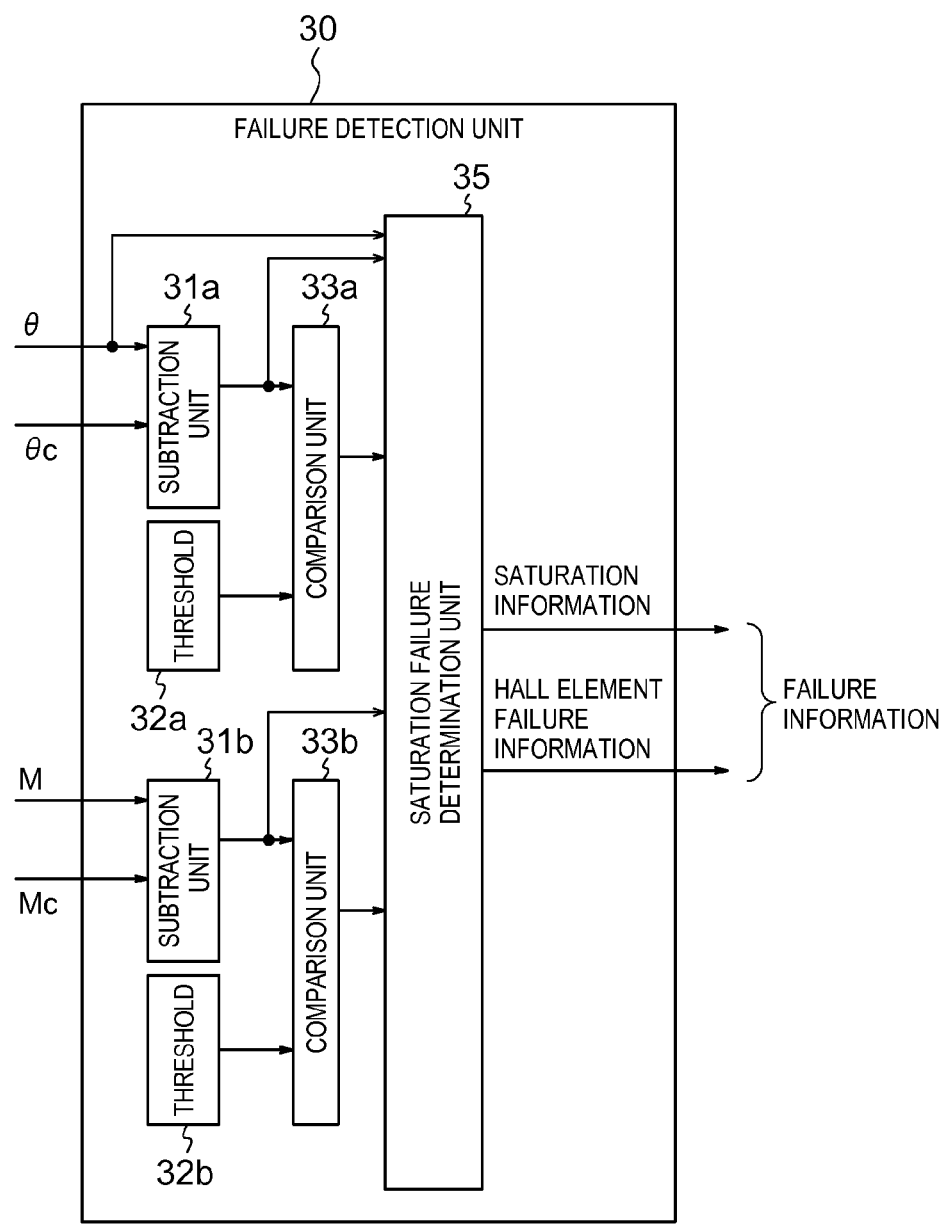
FIG. 23 is a circuit configuration diagram illustrative of further another example of the failure detection unit in FIG. 18.

FIG. 23 is a circuit configuration diagram illustrative of further another example of the failure detection unit in FIG. 18.

The failure detection units 30 of FIG. 19 and FIG. 22 are configured to detect whether or not a failure of the magnetic saturation is occurring from the first and second rotation angles θ and θc and the first and second amplitude values M and Mc. The failure detection unit 30 of FIG. 23, however, is capable of determining whether the Hall element has a failure or whether the magnetic saturation is occurring.

The failure detection unit 30 of FIG. 23 includes: a first subtraction unit 31a; the first comparison unit 33a; the first threshold memory 32a; a second subtraction unit 31b; and a second comparison unit 33b; a second threshold memory 32b; and a saturation failure determination unit (a failure combination determination unit) 35.

The first subtraction unit 31a calculates θd from the first rotation angle θ and the second rotation angle θc, and outputs θd to the saturation failure determination unit 35 and the first comparison unit 33a. The first comparison unit 33a detects a failure from θd and θd_lim (i.e., the threshold) stored in the first threshold memory 32a, and outputs the first failure determination signal to the saturation failure determination unit 35, for example, "1" in a case of failure or "0" in a case of normality.

The second subtraction unit 31b calculates the difference value Md from the first amplitude value M and the second amplitude value Mc, and then outputs the difference value Md to the saturation failure determination unit 35 and the second comparison unit 33b. The second comparison unit 33b detects a failure from Md and Md_lim (i.e., a threshold) stored in the second threshold memory 32b, and outputs the second failure determination signal to the saturation failure determination unit 35, for example, "1" in a case of failure or "0" in a case of normality.

The saturation failure determination unit 35 receives the first rotation angle, θd, the first failure determination signal, Md, and the second failure determination signal, and determines whether the Hall element has a failure or whether the magnetic saturation is occurring. When the Hall element has a failure, the failure information is output, whereas when the magnetic saturation is occurring, the saturation information is output as the failure information. In other words, the saturation failure determination unit 35 determines the magnetic saturation of the magnetic flux concentrator and a failure of the plural Hall element pairs (i.e., the plural Hall elements) based upon one piece of rotation angle information of the plural pieces of rotation angle information, a difference value between two pieces of rotation angle information of the plural pieces of rotation angle information, a difference value between two pieces of amplitude information of the plural pieces of amplitude information, the first failure determination signal, and the second failure determination signal.

Figure 24:
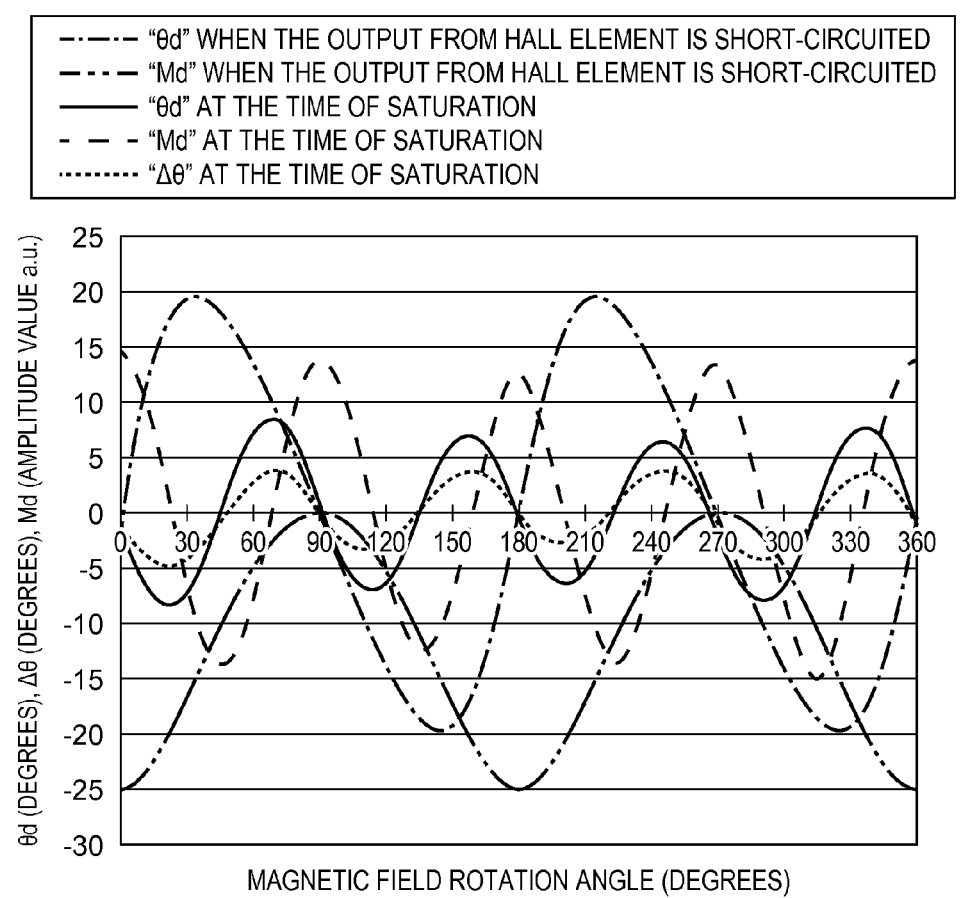
FIG. 24 is a diagram illustrative of simulation results of the angle error Δθ of the first rotation angle θ, θd, and Md, when the magnetic saturation of the magnetic flux concentrator occurs and when the output from the Hall element H0 in the XY coordinate system is short-circuited (i.e., the output is 0)

FIG. 24 is a diagram illustrative of simulation results of the angle error Δθ of the first rotation angle θ, θd, and Md, when the magnetic saturation of the magnetic flux concentrator occurs and when the output from the Hall element H0 in the XY coordinate system is short-circuited (i.e., the output is 0).

The solid line indicates θd, the dotted line indicates the angle error Δθ of the first rotation angle θ, and the broken line indicates Md, at the time of the magnetic saturation, and in addition, the dashed line indicates θd, and the double-dashed line indicates Md, in the case where the output from the Hall element H0 is short-circuited. There is no failure occurring at the third and fourth Hall element pairs of the XY45 coordinate system in the latter case. Hence, the angle error Δθc of the second rotation angle θc is 0, and the angle error Δθ of the first rotation angle θ agrees with θd, and is omitted.

As appreciated from FIG. 24, when the angle difference θd is 0, in either case of the magnetic saturation or the failure of the Hall element, Δθ also becomes 0. Therefore, the first rotation angle θ that is calculated is correct. In addition, for example, when the rotation angle of the magnetic field is 0 degree, the difference value Md of the amplitude takes a positive value. However, the difference value Md takes a negative value in the case of a failure of the Hall element. Thus, when the angle difference θd is 0, the first rotation angle θ is 0, and the difference value Md of the amplitude takes a negative value instead of 0, the Hall element H0 is short-circuited. Further, when Md takes a positive value instead of 0, it can be determined that the magnetic saturation is occurring.

As illustrated in the following TABLE 2, a failure of the other Hall elements H45, H90, H135, H180, H225, H270, and H315 can be determined in a similar manner. In TABLE 2, θd, the first failure determination signal, Md, the second failure determination signal, the first rotation angle θ, positive and negative values of Md, and determination results are displayed in column.

TABLE 2

| θd | FIRST FAILURE DETERMINATION SIGNAL | Md | SECOND FAILURE DETERMINATION SIGNAL | FIRST ROTATION ANGLE θ | POS/NEG OF Md | DETERMINATION RESULT |
|---|---|---|---|---|---|---|
| 0 | 0 | NOT 0 | 1 | 0 or 180 DEGREES | NEGATIVE | FAILURE OF H0 OR H180 |
| 0 | 0 | NOT 0 | 1 | 45 or 225 DEGREES | POSITIVE | FAILURE OF H45 OR H225 |
| 0 | 0 | NOT 0 | 1 | 90 or 270 DEGREES | NEGATIVE | FAILURE OF H90 OR H270 |
| 0 | 0 | NOT 0 | 1 | 135 or 315 DEGREES | POSITIVE | FAILURE OF H135 OR H315 |
| 0 | 0 | NOT 0 | 1 | 0 or 180 DEGREES | POSITIVE | MAGNETIC SATURATION |
| 0 | 0 | NOT 0 | 1 | 45 or 225 DEGREES | NEGATIVE | MAGNETIC SATURATION |
| 0 | 0 | NOT 0 | 1 | 90 or 270 DEGREES | POSITIVE | MAGNETIC SATURATION |
| 0 | 0 | NOT 0 | 1 | 135 or 315 DEGREES | NEGATIVE | MAGNETIC SATURATION |

In other words, on receipt of the first rotation angle θ, the output θd from the first subtraction unit 31*a*, the output from the first comparison unit 33*a*, the output from the second subtraction unit 31*b*, and the output from the second comparison unit 33*b*, the saturation failure determination unit 35 makes the above determination, so as to output the failure information, when the Hall element has a failure, and output the saturation information, when the magnetic saturation is occurring.

That is to say, the failure detection unit 30 is capable of detecting whether the Hall element has a failure or whether the magnetic saturation is occurring from the first and second rotation angles θ and θc and the first and second amplitude values M and Mc.

According to the advantageous effects brought about by the present invention, it is possible to determine what kind of failure is occurring, and it is significantly beneficial to the rotation angle sensor to be used for an application requiring strict safety such as in-vehicle application, in particular.

As described above, the following is apparent from the descriptions of the embodiments. In an XY coordinate system formed by the Hall element group under the magnetic flux concentrator, the angle error and the amplitude value representing the strength of the input magnetic field form cyclic quadruple waves due to the magnetic saturation. Therefore, in a different XY coordinate system formed by another Hall element group, by generating quadruple waves which have different phases from those waves generated in the XY coordinate system and indicate the angle error and the amplitude representing the strength of the input magnetic field, it is made possible to detect the magnetic saturation or a failure of the Hall element with accuracy from the angle and the amplitude value of the XY coordinate system and the angle and the amplitude value of the different XY coordinate system.

It is to be noted that, in the description of the third embodiment having the above-described amplitude calculation unit 42, the failure detection unit 30 detects the magnetic saturation based upon the first and second rotation angles θ and θc, the first and second amplitude values M and Mc. As is appreciated from the foregoing description, however, it is possible to detect the magnetic saturation more accurately than the case of the conventional technique, by use of only the first and second amplitude values M and Mc without use of the first and second rotation angles θ and θc. In other words, it is possible to detect the magnetic saturation (and output the failure information) more accurately from the second subtraction unit 31*b*, the second comparison unit 33*b*, the second threshold memory (the second reference signal output unit) 32*b* of the failure detection unit 30 in FIG. 19. In addition, it is possible to detect the magnetic saturation (and output of the failure information) more accurately from the second comparison unit 33*b*, the second threshold memory 32*b*, the third comparison unit 33*c*, and the third threshold memory (the third reference signal output unit) 32*c* of the failure detection unit 30 in FIG. 22. Such a case is also included in the present invention. However, preferably, the failure information can be output with accuracy at all the rotation angles of the magnetic field, based upon the first and second rotation angles θ and θc and the first and second amplitude values M and Mc.

Moreover, in the description of the third embodiment having the above-mentioned amplitude calculation unit 42, the arrangements of the magnetic flux concentrator and the Hall elements are the same as those of FIG. 7 according to the first embodiment of the present invention. In other words, with respect to the XY coordinate system, it is assumed that the XY45 coordinate system as an additional coordinate system is rotated around G by 45 degrees in the XY coordinate system. However, the present invention is not limited to the above arrangement, even if the amplitude calculation unit 42 is included. In other words, even in the case of an additional coordinate system that is not rotated around G by 45 degrees, when the magnetic saturation is occurring, the phases are different between the quadruple waves of the first amplitude value M representing the strength of the input magnetic field calculated in the XY coordinate system and the second amplitude value Mc calculated in the different coordinate system. Therefore, it is possible to detect the magnetic saturation more accurately, and such a case is also included in the present invention. In the case of an additional coordinate system that is rotated around G by 45 degrees, the phases are different by 180 degrees between the quadruple waves representing the amplitudes, so it is made possible to improve the detection sensitivity. Thus, it is preferable to use this invention.

Furthermore, in the description of the embodiments of the present invention, the MUX, the subtraction unit, the angle calculation unit, and the amplitude calculation unit in the later stage of the Hall elements are configured in the way that the signals from the Hall elements in each arrangement group are made available in a time-division manner in the configuration of the signal processing circuit illustrated in FIG. 10A to FIG. 10D, FIG. 16, and FIG. 18. In order to achieve the high-speed processing, however, the X axis subtraction unit, the Y axis subtraction unit, the angle calculation unit, and the amplitude calculation unit may be provided for every arrangement group of the Hall elements for parallel signal processing. Additionally, the average calculation unit or the failure detection unit may be made of an external CPU, without forming the average calculation unit or the failure detection unit on the same substrate as the Hall elements. Such a configuration of the signal processing circuit is also included in the technical scope of the present invention.

In all of the above-described embodiments, the systems conform with ISO 26262, the angle calculation unit is an angle information output unit in conformity with ISO 26262 to output the rotation angle information of the rotating magnet in conformity with ISO 26262. Further, from a different viewpoint, in all of the above-described embodiments, the systems are functional safety systems, and the angle calculation unit is a functional safety angle information output unit outputting the rotation angle information of the rotating magnet in functional safety, that is functionally safely. Furthermore, from another different viewpoint, in all of the above-described embodiments, the systems are duplex output systems of the rotation angle information, and the angle calculation unit is a duplex angle information output unit outputting the duplex rotation angle information of the rotating magnet.

Fourth Embodiment

Figure 25:
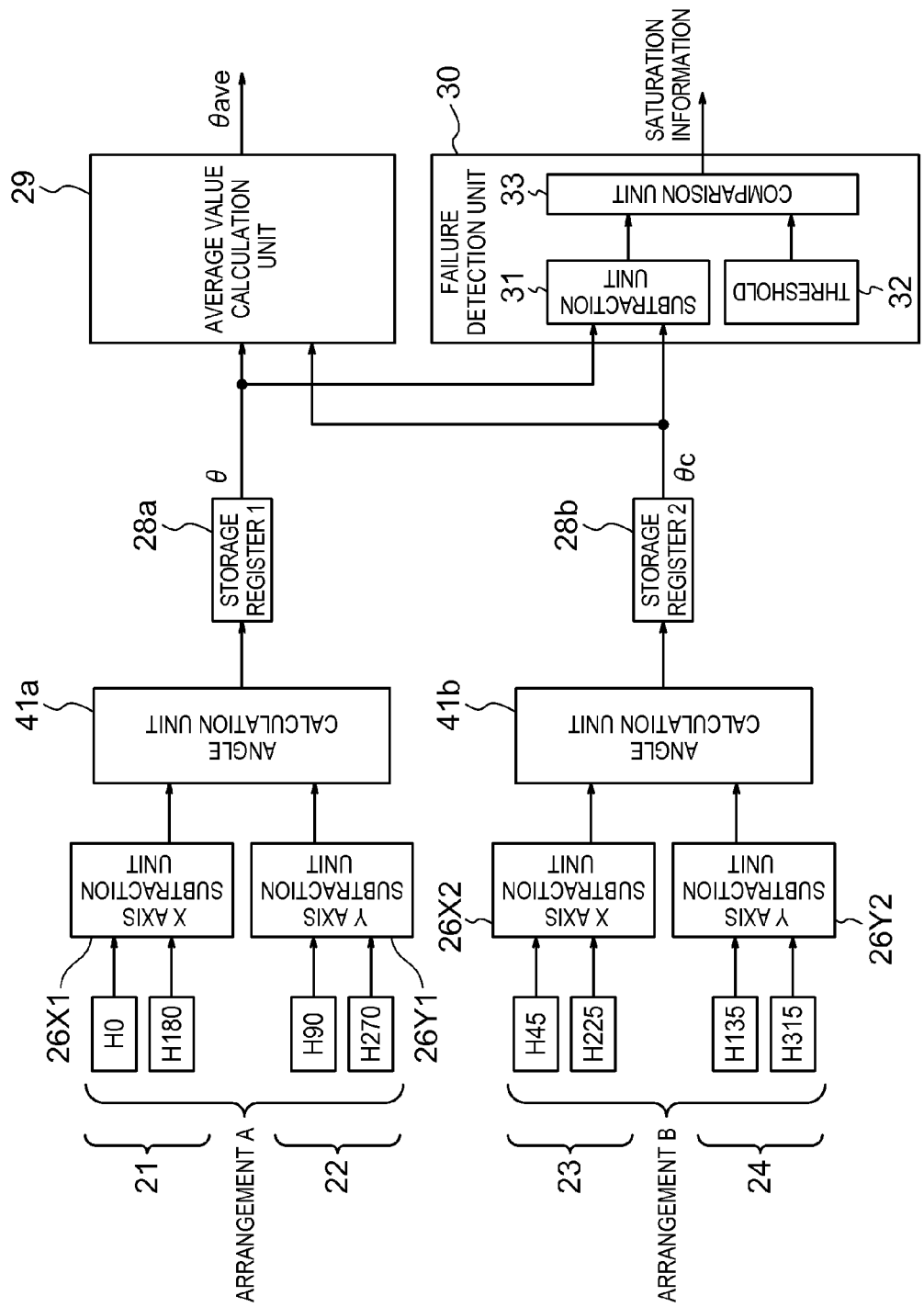
FIG. 25 is a configuration diagram illustrative of a signal processing circuit of the rotation angle measurement apparatus according to a fourth embodiment of the present invention.

FIG. 25 is a configuration diagram illustrative of a signal processing circuit of the rotation angle measurement apparatus according to a fourth embodiment of the present invention. It is to be noted that the arrangements of the magnetic flux concentrator and the Hall elements are same as those of FIG. 7 according to the above-described first embodiment of the present invention.

As already described above, in the configurations of the signal processing circuits of FIG. 10A to FIG. 10D, FIG. 16, and FIG. 18, in order to achieve the high-speed processing, the X axis subtraction unit, the Y axis subtraction unit, the angle calculation unit, and the amplitude calculation unit may be provided for every arrangement group of the Hall elements for parallel signal processing.

In FIG. 25, the rotation angle measurement apparatus includes: the first Hall element pair 21 (H0, H180) in the arrangement A; the second Hall element pair 22 (H90, H270) in the arrangement A; the third Hall element pair 23 (H45, H225) in the arrangement B; the fourth Hall element pair 24 (H135, H315) in the arrangement B; a first X axis subtraction unit 26X1; a first Y axis subtraction unit 26Y1; a first angle calculation unit 41a; the first storage register 28a; a second X axis subtraction unit 26X2; a second Y axis subtraction unit 26Y2; a second angle calculation unit 41b; the second storage register 28b; the average value calculation unit 29; and the failure detection unit 30. The failure detection unit 30 includes: the subtraction unit 31; the threshold comparison unit 33; and the threshold memory 32.

The first angle calculation unit 41a calculates the first rotation angle θ of the rotating magnet based upon the strengths of the output signals from the first Hall element pair 21 and the second Hall element pair 22. The second angle calculation unit 41b calculates the second rotation angle θc of the rotating magnet based upon the strengths of the output signals from the third Hall element pair 23 and the fourth Hall element pair 24. That is to say, in the fourth embodiment of the present invention, two angle calculation units calculate plural pieces of rotation angle information.

The average value calculation unit 29 and the failure detection unit 30 are same as those in the above-described first embodiment, and the descriptions thereof will be omitted.

In FIG. 25, the outputs from the first Hall element pair 21 (H0, H180) in the arrangement A are input to the first X axis subtraction unit 26X1. The outputs from the second Hall element pair 22 (H90, H270) are input to the first Y axis subtraction unit 26Y1. The first X axis subtraction unit 26X1 outputs the output signal HVX to the first angle calculation unit 41a. The first Y axis subtraction unit 26Y1 outputs the output signal HVY to the first angle calculation unit 41a.

The first angle calculation unit 41a calculates the angle θ of the XY coordinate system from HVX and HVY, and outputs it to the first storage register 28a.

The outputs from the third Hall element pair 23 (H45, H225) in the arrangement B are input to the second X axis subtraction unit 26X2. The outputs from the fourth Hall element pair 24 (H135, H315) are input to the second Y axis subtraction unit 26Y2. The second X axis subtraction unit 26X2 outputs the output signal HVX45 to the second angle calculation unit 41b. The second Y axis subtraction unit 26Y2 output the output signal HVY45 to the second angle calculation unit 41b.

The second angle calculation unit 41b calculates the angle θ45 of the XY45 coordinate system from HVX45 and HVY45, and outputs it to the second storage register 28b. The first storage register 28a output θ to the average value calculation unit 29 and the failure detection unit 30. The second storage register 28b output θc to the average value calculation unit 29 and the failure detection unit 30.

The operations of the average value calculation unit 29 and the failure detection unit 30 are same as those in the first embodiment of the present invention.

By configuring the rotation angle measurement apparatus as described above, the first rotation angle and the second rotation angle can be calculated at the same time. Therefore, it is made possible to perform the signal processing at a high speed, the angle calculation with high accuracy, and the detection of the magnetic saturation at a high speed.

The first rotation angle and the second rotation angle are calculated by different angle calculation units, as described above. Therefore, if a failure occurs from the Hall elements to the angle calculation unit, the failure detection unit is capable of detecting a failure by use of the relational expression of |θd|<θd_lim, from the difference θd between the first rotation angle and the second rotation angle, and the suitable threshold θd_lim, in the same manner as described in the first embodiment of the present invention.

In other words, according to the present invention, not only the magnetic saturation but also a failure from the Hall elements to the angle calculation unit is detectable.

Fifth Embodiment

Figure 26:
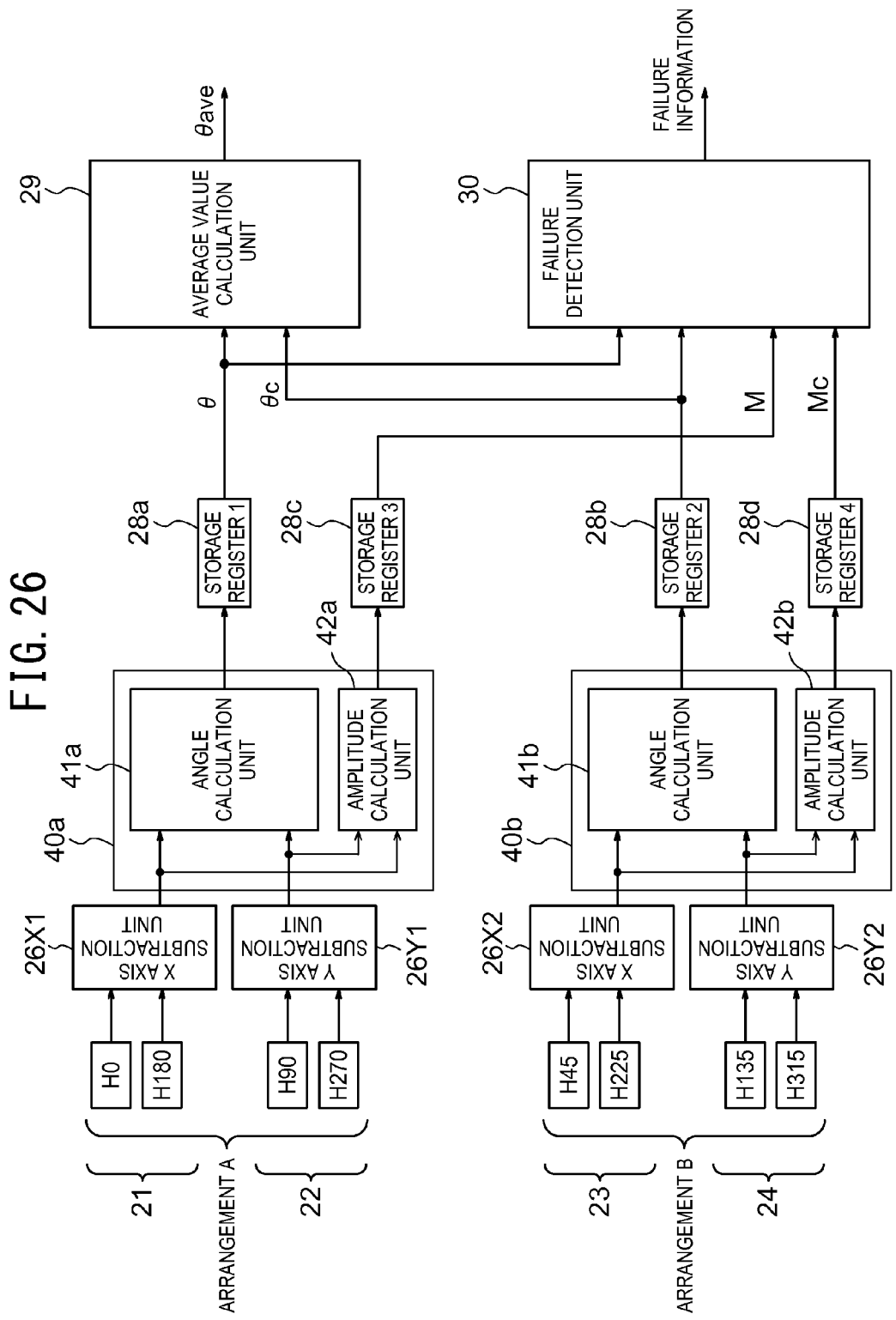
FIG. 26 is a configuration diagram illustrative of a signal processing circuit of the rotation angle measurement apparatus according to a fifth embodiment of the present invention.

FIG. 26 is a configuration diagram illustrative of a signal processing circuit of the rotation angle measurement apparatus according to a fifth embodiment of the present invention. In the fifth embodiment of the present invention, the angle amplitude calculation unit described in the third embodiment is provided for every arrangement group of the Hall elements for parallel signal processing. It is to be noted that the arrangements of the magnetic flux concentrator and the Hall elements are same as those of FIG. 7 according to the above-described first embodiment of the present invention.

In FIG. 26, the rotation angle measurement apparatus includes: the first Hall element pair 21 (H0, H180) in the arrangement A; the second Hall element pair 22 (H90, H270) in the arrangement A; the third Hall element pair 23 (H45, H225) in the arrangement B; the fourth Hall element pair 24 (H135, H315) in the arrangement B; the first X axis subtraction unit 26X1; the first Y axis subtraction unit 26Y1; a first angle amplitude calculation unit 40a; the first storage register 28a; the third storage register 28c; the second X axis subtraction unit 26X2; the second Y axis subtraction unit 26Y2; a second angle amplitude calculation unit 40b; the second storage register 28b; the fourth storage register 28d; the average value calculation unit 29; and the failure detection unit 30.

The first angle amplitude calculation unit 40a includes the first angle calculation unit 41a, and a first amplitude calculation unit 42a. The second angle amplitude calculation unit 40b includes the second angle calculation unit 41b, and a second amplitude calculation unit 42b.

The first angle calculation unit 41a calculates the first rotation angle $\theta$ of the rotating magnet based upon the strengths of the output signals from the first Hall element pair 21 and the second Hall element pair 22. The second angle calculation unit 41b calculates the second rotation angle $\theta c$ of the rotating magnet based upon the strengths of the output signals from the third Hall element pair 23 and the fourth Hall element pair 24.

The first amplitude calculation unit 42a calculates the first amplitude value M representing the magnetic field strength from the rotating magnet based upon the strengths of the output signals from the first Hall element pair 21 and the second Hall element pair 22. The second amplitude calculation unit 42b calculates the second amplitude value Mc representing the magnetic field strength from the rotating magnet based upon the strengths of the output signals from the third Hall element pair 23 and the fourth Hall element pair 24. The operation of the average value calculation unit 29 is same as that of the above-described first embodiment of the present invention.

The failure detection unit 30 is configured by any one of the configurations in FIG. 19, FIG. 22, and FIG. 23, as described in the third embodiment of the present invention. In FIG. 26, the outputs from the first Hall element pair 21 (H0, H180) in the arrangement A are input to the first X axis subtraction unit 26X1.

The outputs from the second Hall element pair 22 (H90, H270) are input to the first Y axis subtraction unit 26Y1. The first X axis subtraction unit 26X1 outputs the output signal HVX to the first angle calculation unit 41a and the first amplitude calculation unit 42a of the first angle amplitude calculation unit 40a. The first Y axis subtraction unit 26Y1 outputs the output signal HVY to the first angle calculation unit 41a and the first amplitude calculation unit 42a of the first angle amplitude calculation unit 40a.

The outputs from the third Hall element pair 23 (H45, H225) in the arrangement B are input to the second X axis subtraction unit 26X2. The outputs from the fourth Hall element pair 24 (H135, H315) are input to the second Y axis subtraction unit 26Y2. The second X axis subtraction unit 26X2 outputs the output signal HVX45 to the second angle calculation unit 41b and the second amplitude calculation unit 42b of the second angle amplification calculation unit 40b. The second Y axis subtraction unit 26Y2 outputs the output signal HVY45 to the second angle calculation unit 41b and the second amplitude calculation unit 42b of the second angle amplification calculation unit 40b.

The first angle calculation unit 41a calculates the angle $\theta$ of the XY coordinate system from HVX and HVY, and outputs it to the first storage register 28a. The first amplitude calculation unit 42a calculates the amplitude value M from HVX and HVY, and outputs it to the third storage register 28c. The second angle calculation unit 41b calculates the angle $\theta 45$ of the XY45 coordinate system from HVX45 and HVY45, and outputs it to the second storage register 28b. The second amplitude calculation unit 42b calculates the amplitude value Mc from HVX45 and HVY45, and outputs it to the fourth storage register 28d. The first storage register 28a outputs $\theta$ to the average value calculation unit 29 and the failure detection unit 30. The second storage register 28b outputs $\theta c$ to the average value calculation unit 29 and the failure detection unit 30. The third storage register 28c outputs M to the failure detection unit 30. The forth storage register 28d outputs Mc to the failure detection unit 30.

The operations of the average value calculation unit 29 and the failure detection unit 30 are same as those of the above-described first embodiment of the present invention, and the descriptions thereof will be omitted.

By configuring the rotation angle measurement apparatus as described above, the first rotation angle and the second rotation angle can be calculated at the same time. Therefore, it is made possible to perform the signal processing at a high speed, the angle calculation with high accuracy, and the detection of the magnetic saturation at a high speed.

The first rotation angle and the second rotation angle are calculated by different angle calculation units, and the first amplitude value and the second amplitude value are calculated by different amplitude calculation units, as described above. Therefore, if a failure occurs from the Hall elements to the angle amplitude calculation unit, the failure detection unit is capable of detecting a failure, and in addition, the failure detection unit is also capable of detecting a failure of a Hall element, and therefore, even if a failure occurs at a Hall element in one of the coordinate systems, the measurement of the rotation angle can be continued by using the other of the coordinate systems. For example, if a failure occurs at a Hall element in the arrangement A, the first rotation angle is not longer reliable, but as no failure occurs at the Hall elements in the arrangement B, the second rotation angle can be measured and be output continuously. Such advantageous effects of the present invention are significantly beneficial to the rotation angle sensor to be used for an application requiring strict safety such as in-vehicle application. That is, the present embodiment is a functionally safe system in conformity with ISO 26262.

In each of the embodiments of the present invention, the subtraction units calculate the difference between the first and second rotation angles and the difference between the first and second amplitude values, and the comparison units compare the differences with the threshold values. However, any operation can be included in the present invention, as far as the same results can be brought about. In addition, in the descriptions of the third and fifth embodiments of the present invention, the angle amplitude calculation unit 40 is configured from the angle calculation unit 41 and the amplitude calculation unit 42 so as to calculate the angle and amplitude, respectively. However, the angle and amplitude can be calculated at the same time by a single angle amplitude calculation unit, for example, by using a COordinate Rotation DIgital Computer (CORDIC). Any configuration using such an operation is included in the scope of the present invention.

Further, as is apparent from the description heretofore, the advantageous effects of the present invention include the reduction in the angle error caused by the magnetic saturation (extension of the input magnetic field and/or SN improvement) and the detection of the magnetic saturation with accuracy. However, if only one of the advantageous effects is used, either one of the average calculation unit and the failure detection unit may be provided.

In other words, the present invention is not limited to the above-described embodiments, and a design change without departing from the main points is also included in the present invention. That is, it is needless to mention that the variations or modifications that can be achieved by a person skilled in the art are also included in the present invention.

REFERENCE SIGNS LIST 1 rotating magnet
2 integrated circuit (silicon substrate)
3 Hall element
4, 14 magnetic flux concentrator
11X X axis subtraction unit
11Y Y axis subtraction unit
12 arithmetic operation unit
21 (H0, H180) first Hall element pair
22 (H90, H270) second Hall element pair
23 (H45, H225) third Hall element pair
24 (H135, H315) fourth Hall element pair
25, 225 MUX (multiplexer)
26X, 226X X axis subtraction unit
26X1 first X axis subtraction unit
26X2 second X axis subtraction unit
26Y, 226Y Y axis subtraction unit
26Y1 first Y axis subtraction unit
26Y2 second Y axis subtraction unit
27, 227 angle calculation unit
28a, 228a first storage register
28b, 228b second storage register
28c, 228c third storage register
28d fourth storage register
29, 229 average value calculation unit
30, 230 saturation detection unit
31 subtraction unit (difference calculation unit)
31a, 231a first subtraction unit (first difference calculation unit)
31b, 231b second subtraction unit (second difference calculation unit)
32, 232 threshold memory (reference signal output unit)
32a first threshold memory (first reference signal output unit)
32b second threshold memory (second reference signal output unit)
32c third threshold memory (third reference signal output unit)
33 threshold comparison unit
33a, 233a first threshold comparison unit
33b, 233b second threshold comparison unit
33c third threshold comparison unit
34 logical sum unit (failure combination determination unit)
35 saturation failure determination unit (failure combination determination unit)
40 angle amplitude calculation unit
40a first angle amplitude calculation unit
40b second angle amplitude calculation unit
41 angle calculation unit
41a first angle calculation unit
41b second angle calculation unit
42 amplitude calculation unit
42a first amplitude calculation unit
42b second amplitude calculation unit
121 (H0, H180) first Hall element pair
122 (H90, H270) second Hall element pair
123 (H30, H210) third Hall element pair
124 (H120, H300) fourth Hall element pair
125 (H60, H240) fifth Hall element pair
126 (H150, H330) sixth Hall element pair

The invention claimed is:

1. A rotation angle measurement apparatus comprising:
a plurality of Hall element pairs;
a magnetic flux concentrator provided on magnetosensitive planes of the plurality of Hall element pairs;
a rotating magnet arranged in proximity to the magnetic flux concentrator to cover the magnetic flux concentrator in a planer view;
an angle calculation unit configured to calculate a plurality of pieces of rotation angle information of the rotating magnet based upon output signals from a plurality of sets of the plurality of Hall element pairs, and
a rotation angle information correction unit configured to correct the rotation angle information in consideration of the plurality of pieces of rotation angle information.

2. The rotation angle measurement apparatus according to claim 1, wherein the rotation angle information correction unit calculates an average value from the plurality of pieces of rotation angle information.

3. The rotation angle measurement apparatus according to claim 1, wherein the rotation angle information correction unit calculates an added value from the plurality of pieces of rotation angle information.

4. The rotation angle measurement apparatus according to claim 1, wherein the rotation angle information correction unit calculates a center value from the plurality of pieces of rotation angle information.

5. The rotation angle measurement apparatus according to claim 1, wherein when a polar coordinate is defined on the magnetic flux concentrator, the plurality of Hall element pairs are arranged at positions of coordinate axes of an integral multiple of 90°/N, where N is an integer of 2 or more, with the origin of the polar coordinate being as a reference.

6. The rotation angle measurement apparatus according to claim 5, wherein the plurality of Hall element pairs are arranged at intervals of 45 degrees under a circumference of the magnetic flux concentrator with the origin of the polar coordinate being as the reference.

7. The rotation angle measurement apparatus according to claim 5, wherein the plurality of Hall element pairs are arranged at intervals of 30 degrees under a circumference of the magnetic flux concentrator with the origin of the polar coordinate being as the reference.

8. The rotation angle measurement apparatus according to claim 1, wherein when a polar coordinate is defined on the magnetic flux concentrator, two Hall element pairs of the plurality of Hall element pairs are arranged to interpose coordinate axes of an integral multiple of 90°/N, where N is an integer of 2 or more, with the origin of the polar coordinate being as a reference.

9. The rotation angle measurement apparatus according to claim 1, further comprising an amplitude calculation unit configured to calculate a plurality of pieces of amplitude information based upon the output signals from the plurality of sets of the plurality of Hall element pairs, the output signals corresponding to the plurality of pieces of rotation angle information.

10. A rotation angle measurement apparatus comprising:
a plurality of Hall element pairs;
a magnetic flux concentrator provided on magnetosensitive planes of the plurality of Hall element pairs;
a rotating magnet arranged in proximity to the magnetic flux concentrator to cover the magnetic flux concentrator in a planer view;
an angle calculation unit configured to calculate a plurality of pieces of rotation angle information of the rotating magnet based upon output signals from a plurality of sets of the plurality of Hall element pairs, and
a failure detection unit configured to detect a failure of the rotation angle measurement apparatus based upon outputs from the angle calculation unit.

11. The rotation angle measurement apparatus according to claim 10, wherein the failure detection unit detects the failure of the rotation angle measurement apparatus based upon the outputs from the angle calculation unit and a reference signal that is output from a reference signal output unit.

12. The rotation angle measurement apparatus according to claim 11, wherein the failure detection unit detects the failure of the rotation angle measurement apparatus based upon a difference between two pieces of the plurality of pieces of rotation angle information and the reference signal.

13. The rotation angle measurement apparatus according to claim 12, further comprising a difference calculation unit configured to calculate the difference.

14. The rotation angle measurement apparatus according to claim 10, wherein the failure detection unit detects magnetic saturation of the magnetic flux concentrator.

15. The rotation angle measurement apparatus according to claim 10,
wherein the plurality of sets of the plurality of Hall element pairs include at least three sets, and
wherein the failure detection unit calculates at least two differences, each of which is a difference between two pieces of the plurality of pieces of rotation angle information, and detects the failure of the rotation angle measurement apparatus based upon the at least two differences and a reference signal that is output from a reference signal output unit.

16. The rotation angle measurement apparatus according to claim 15, wherein the failure detection unit compares the at least two differences with the reference signal, outputs signals each indicating whether or not the rotation angle measurement apparatus has the failure, and determines that the rotation angle measurement apparatus has the failure, when at least one of the signals indicates the failure.

17. The rotation angle measurement apparatus according to claim 10,
further comprising an amplitude calculation unit configured to calculate a plurality of pieces of amplitude information based upon the output signals from the plurality of sets of the plurality of Hall element pairs, the output signals corresponding to the plurality of pieces of rotation angle information,
wherein the failure detection unit detects the failure of the rotation angle measurement apparatus based upon the plurality of pieces of amplitude information.

18. The rotation angle measurement apparatus according to claim 17, wherein the failure detection unit detects the failure of the rotation angle measurement apparatus based upon the plurality of pieces of amplitude information and a second reference signal that is output from a second reference signal output unit.

19. The rotation angle measurement apparatus according to claim 18, wherein the failure detection unit compares a difference between two pieces of amplitude information of the plurality of pieces of amplitude information with the second reference signal to detect the failure of the rotation angle measurement apparatus.

20. The rotation angle measurement apparatus according to claim 19, wherein the failure detection unit outputs a first failure determination signal indicating whether or not the rotation angle measurement apparatus has the failure based upon the outputs from the angle calculation unit, outputs a second failure determination signal indicating whether or not the rotation angle measurement apparatus has the failure based upon the plurality of pieces of amplitude information, and determines that the rotation angle measurement apparatus has the failure when at least one of the first failure determination signal and the second failure determination signal indicates the failure.

21. The rotation angle measurement apparatus according to claim 19, wherein the failure detection unit further comprising a determination unit configured to output a first failure determination signal indicating whether or not the rotation angle measurement apparatus has the failure based upon the outputs from the angle calculation unit, and output a second failure determination signal indicating whether or not the rotation angle measurement apparatus has the failure based upon the plurality of pieces of amplitude information, to determine magnetic saturation of the magnetic flux concentrator and determine a failure of the plurality of Hall element pairs based upon one piece of the plurality of pieces of rotation angle information, a difference between two pieces of the plurality of pieces of rotation angle information, a difference between two pieces of the plurality of pieces of amplitude information, the first failure determination signal, and the second failure determination signal.

22. The rotation angle measurement apparatus according to claim 17, wherein the failure determination unit detects the failure of the rotation angle measurement apparatus based upon the plurality of pieces of amplitude information, a second reference signal that is output from a second reference signal output unit, and a third reference signal that is output from a third reference signal output unit.

23. The rotation angle measurement apparatus according to claim 22, wherein the failure determination unit compares first amplitude information of the plurality of pieces of amplitude information with the second reference signal, and compares second amplitude information of the plurality of pieces of amplitude information different from the first amplitude information with the third reference signal to detect the failure of the rotation angle measurement apparatus.

24. The rotation angle measurement apparatus according to claim 23, wherein the failure detection unit outputs a first failure determination signal indicating whether or not the rotation angle measurement apparatus has the failure based upon the outputs from the angle calculation unit, outputs a second failure determination signal indicating whether or not the rotation angle measurement apparatus has the failure based upon the first amplitude information, outputs a third failure determination signal indicating whether or not the rotation angle measurement apparatus has the failure based upon the second amplitude information, and determines that the rotation angle measurement apparatus has the failure when at least one of the first to third failure determination signals indicates the failure.

25. A rotation angle measurement apparatus comprising:
a plurality of Hall element pairs;
a magnetic flux concentrator provided on magnetosensitive planes of the plurality of Hall element pairs;
a rotating magnet arranged in proximity to the magnetic flux concentrator to cover the magnetic flux concentrator in a planer view;
an angle calculation unit configured to calculate a plurality of pieces of rotation angle information of the rotating magnet based upon output signals from a plurality of sets of the plurality of Hall element pairs;
an amplitude calculation unit configured to calculate a plurality of pieces of amplitude information based upon the output signals from the plurality of sets of the plurality of Hall element pairs, the output signals corresponding to the plurality of pieces of rotation angle information, and
a failure detection unit configured to detect the failure of the rotation angle measurement apparatus based upon outputs from the amplitude calculation unit.

26. The rotation angle measurement apparatus according to claim 25, wherein the failure detection unit detects the failure of the rotation angle measurement apparatus based upon the plurality of pieces of amplitude information and a second reference signal that is output from a second reference signal output unit.

27. The rotation angle measurement apparatus according to claim 26, wherein the failure detection unit compares a difference between two pieces of amplitude information of the plurality of pieces of amplitude information with the second reference signal to detect the failure of the rotation angle measurement apparatus.

28. A rotation angle measurement apparatus comprising:
a plurality of Hall element pairs;
a magnetic flux concentrator provided on magnetosensitive planes of the plurality of Hall element pairs;
a rotating magnet arranged in proximity to the magnetic flux concentrator to cover the magnetic flux concentrator in a planer view;
an angle calculation unit configured to calculate a plurality of pieces of rotation angle information of the rotating magnet based upon output signals from a plurality of sets of the plurality of Hall element pairs;
a rotation angle information correction unit configured to correct the rotation angle information in consideration of the plurality of pieces of rotation angle information;
an amplitude calculation unit configured to calculate a plurality of pieces of amplitude information based upon the output signals from the plurality of sets of the plurality of Hall element pairs, the output signals corresponding to the plurality of pieces of rotation angle information; and
a failure detection unit configured to detect the failure of the rotation angle measurement apparatus based upon outputs from the amplitude calculation unit.

* * * * *